US012713824B2

(12) United States Patent
Takayama

(10) Patent No.: US 12,713,824 B2
(45) Date of Patent: Aug. 18, 2026

(54) MANUFACTURING DEVICE OF DISPLAY DEVICE AND MANUFACTURING METHOD OF DISPLAY DEVICE

(71) Applicant: Magnolia White Corporation, Tokyo (JP)

(72) Inventor: Masaru Takayama, Tokyo (JP)

(73) Assignee: MAGNOLIA WHITE CORPORATION, Tokyo (JP)

(*) Notice: Subject to any disclaimer, the term of this patent is extended or adjusted under 35 U.S.C. 154(b) by 378 days.

(21) Appl. No.: 18/427,817

(22) Filed: Jan. 31, 2024

(65) Prior Publication Data

US 2024/0284772 A1 Aug. 22, 2024

(30) Foreign Application Priority Data

Feb. 17, 2023 (JP) ................................ 2023-023486

(51) Int. Cl.
*H10K 71/12* (2023.01)
*H10K 59/12* (2023.01)
*H10K 59/122* (2023.01)

(52) U.S. Cl.
CPC ......... *H10K 71/12* (2023.02); *H10K 59/1201* (2023.02); *H10K 59/122* (2023.02)

(58) Field of Classification Search
CPC .. H10K 59/122; H10K 59/1201; H10K 71/12; H10K 50/00; H10K 2102/351; H10K 71/70; H10K 71/00; H10K 71/164; H10K 71/60
USPC ........................................................... 438/26
See application file for complete search history.

(56) References Cited

U.S. PATENT DOCUMENTS

| | | | |
|---|---|---|---|
| 2004/0160170 A1 | 8/2004 | Sato et al. | |
| 2009/0009069 A1 | 1/2009 | Takata | |
| 2016/0284614 A1 | 9/2016 | Ooka | |
| 2019/0363275 A1 | 11/2019 | Ochi et al. | |
| 2022/0077251 A1 | 3/2022 | Choung et al. | |
| 2024/0099110 A1* | 3/2024 | Mizukoshi | H10K 59/871 |

FOREIGN PATENT DOCUMENTS

| | | |
|---|---|---|
| JP | 2000-195677 A | 7/2000 |
| JP | 2004-207217 A | 7/2004 |
| JP | 2008-135325 A | 6/2008 |
| JP | 2009-032673 A | 2/2009 |
| JP | 2010-118191 A | 5/2010 |
| JP | 2016-181468 A | 10/2016 |
| WO | 2018/179308 A1 | 10/2018 |

* cited by examiner

*Primary Examiner* — Monica D Harrison
(74) *Attorney, Agent, or Firm* — XSENSUS LLP

(57) ABSTRACT

According to one embodiment, a manufacturing method of a display device includes preparing a processing substrate, forming an organic layer, forming an upper electrode, forming a first transparent layer, and forming a second transparent layer. In a deposition process, an evaporation source emits a material to the processing substrate and a film thickness measurement device, and the film thickness measurement device applies an acoustic impedance correction value which differs depending on a frequency of a crystal oscillator, and measures an evaporation rate based on an amount of change in the frequency of the crystal oscillator, and a controller controls the evaporation source such that the evaporation rate becomes constant.

8 Claims, 16 Drawing Sheets

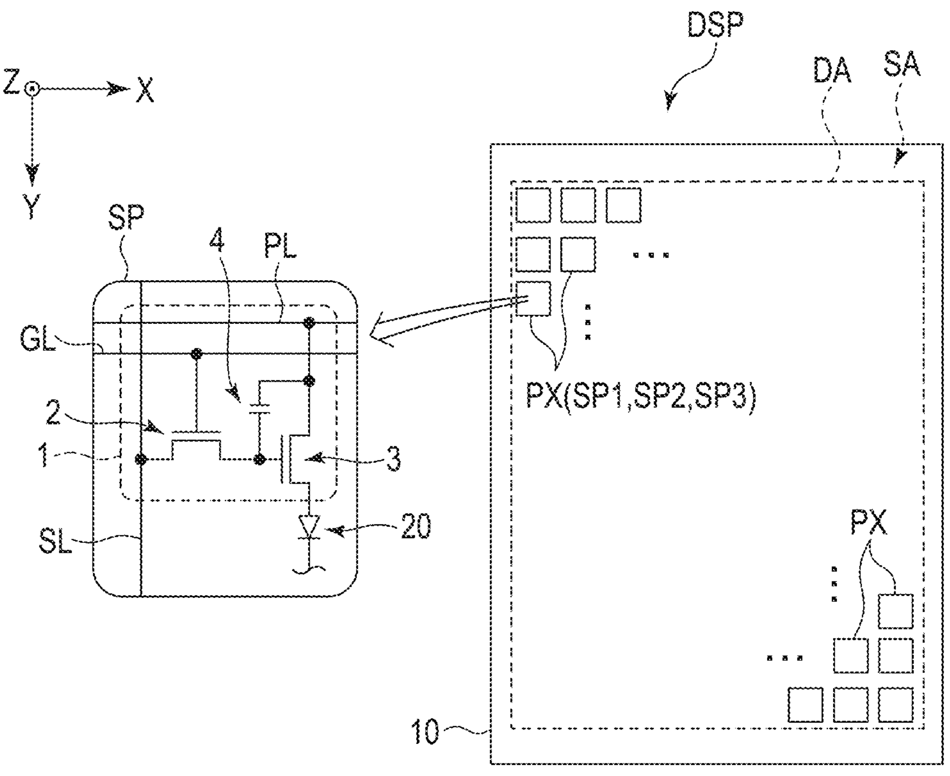
F I G. 1

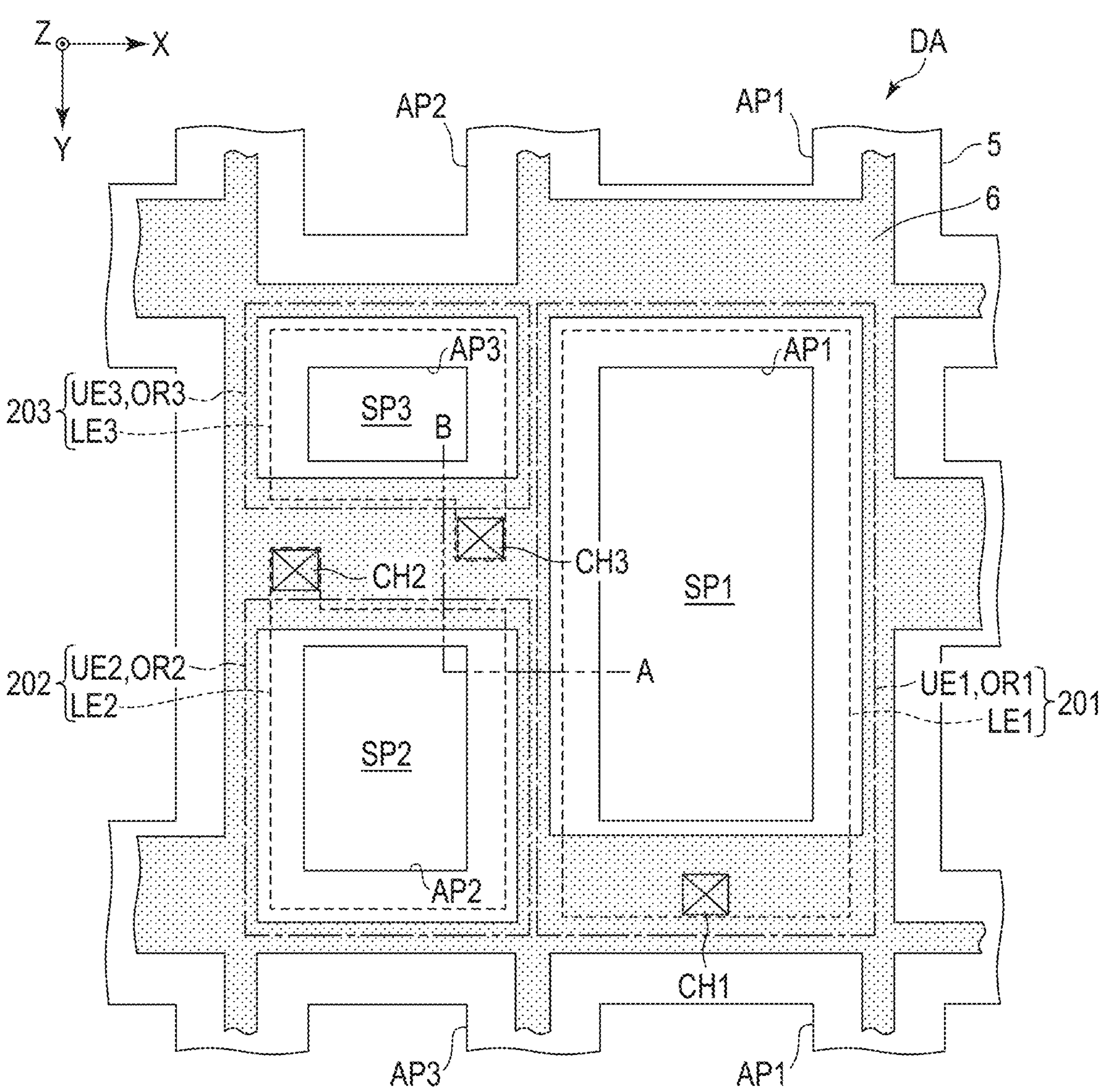
F I G. 2

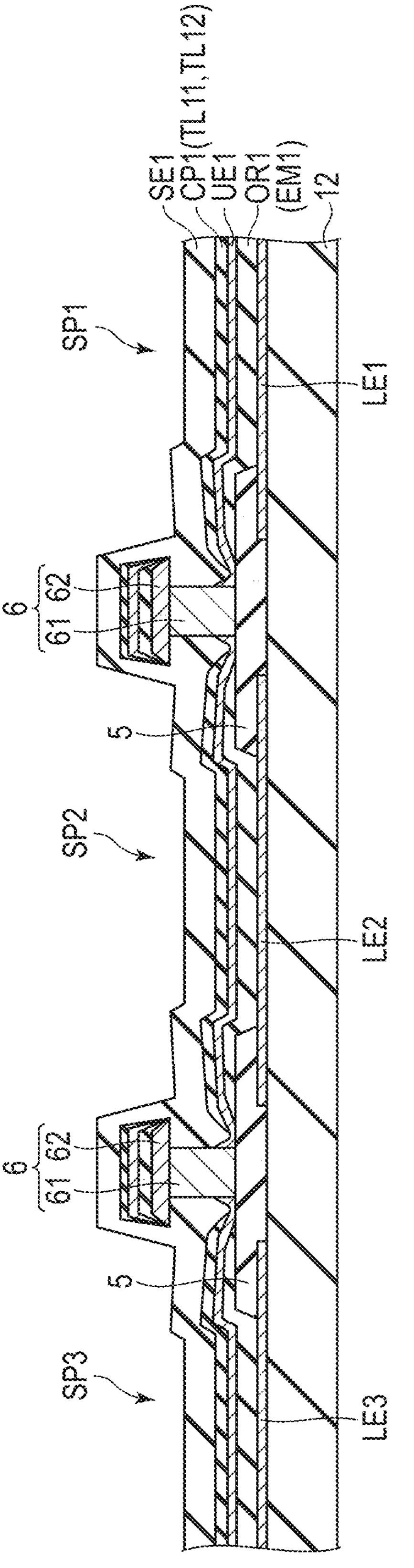
F I G. 6

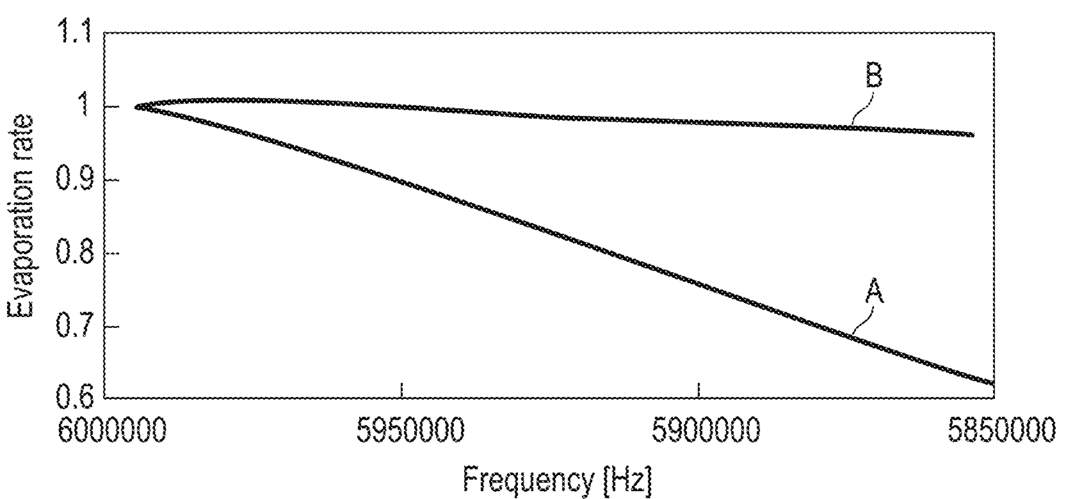
F I G. 15
TB
| F | Z ratio |
|---|---|
| F0 | Z0 |
| F1 | Z1 |
| F2 | Z2 |
| ⋮ | ⋮ |
| Fn | Zn |
| ⋮ | ⋮ |
| Fmin | – |
F I G. 16

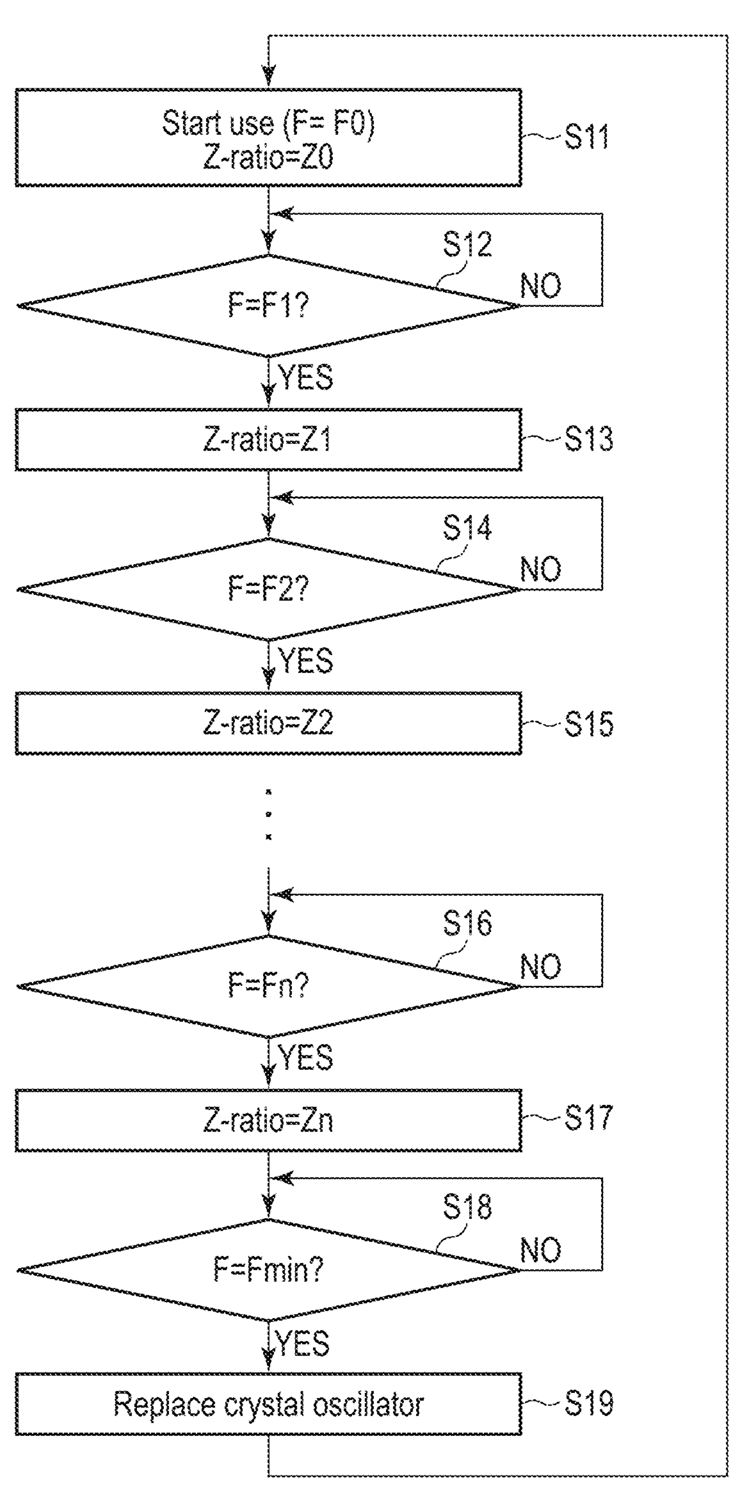
F I G. 17

MANUFACTURING DEVICE OF DISPLAY DEVICE AND MANUFACTURING METHOD OF DISPLAY DEVICE

CROSS-REFERENCE TO RELATED APPLICATIONS

This application is based upon and claims the benefit of priority from Japanese Patent Application No. 2023-023486, filed Feb. 17, 2023, the entire contents of which are incorporated herein by reference.

FIELD

Embodiments described herein relate generally to a manufacturing device of a display device and a manufacturing method of a display device.

BACKGROUND

Recently, display devices to which an organic light emitting diode (OLED) is applied as a display element have been put into practical use. This display element comprises a pixel circuit including a thin-film transistor, a lower electrode connected to the pixel circuit, an organic layer which covers the lower electrode, and an upper electrode which covers the organic layer. The organic layer includes functional layers such as a hole transport layer and an electron transport layer in addition to a light emitting layer.

In a manufacturing device for forming such a display element, the prevention of the reduction in the production efficiency is required.

BRIEF DESCRIPTION OF THE DRAWINGS

FIG. 1 is a diagram showing a configuration example of a display device DSP.

FIG. 2 is a diagram showing an example of the layout of subpixels SP1, SP2 and SP3.

FIG. 6 is a diagram for explaining the manufacturing method of the display device DSP.

FIG. 15 explains an example of correction by an acoustic impedance correction value.

FIG. 16 is a diagram showing an example of a table TB held by a film thickness measurement device 320.

FIG. 17 is a flowchart for explaining an application example of an acoustic impedance correction value.

DETAILED DESCRIPTION

Figure 3:
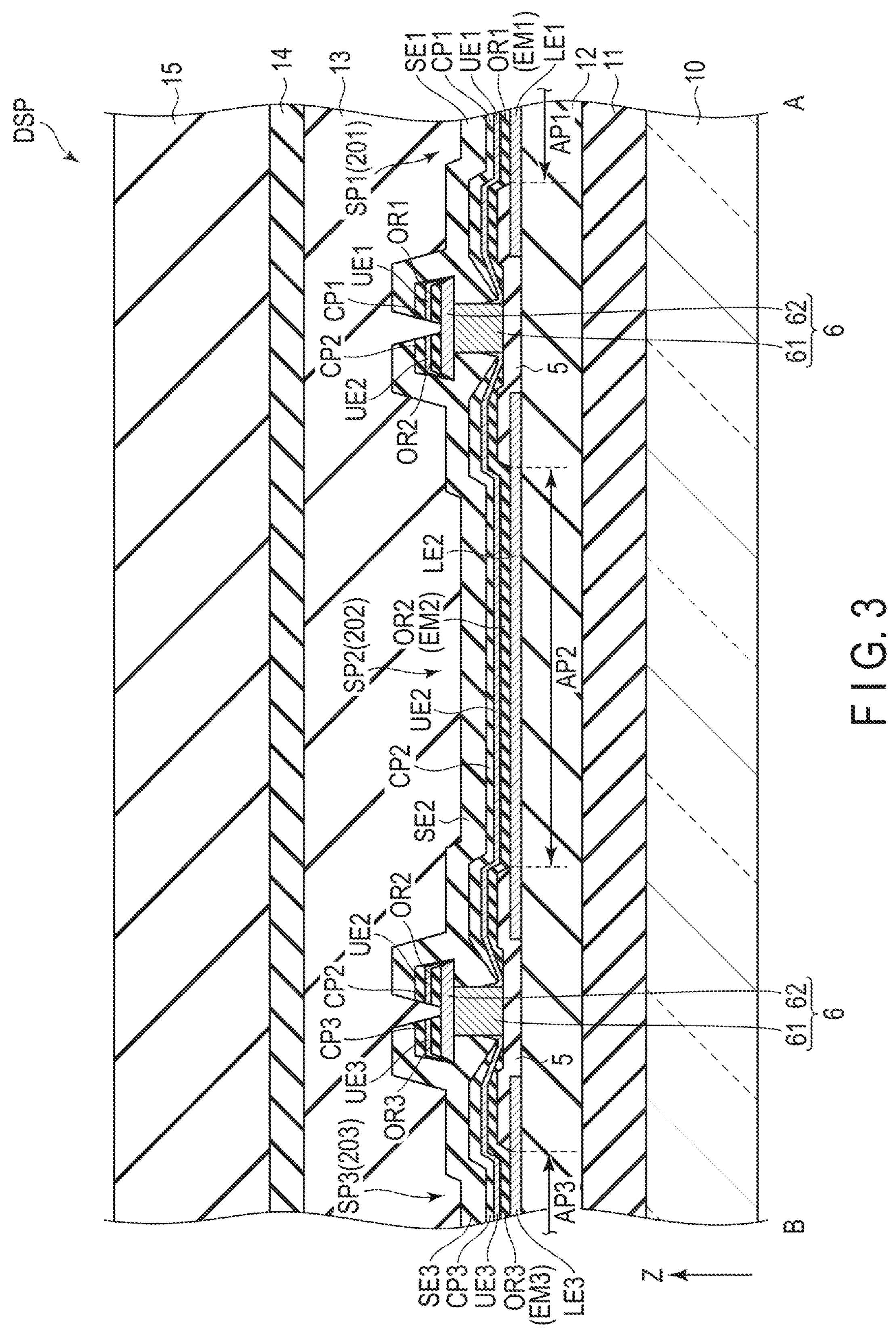
FIG. 3 is a schematic cross-sectional view of the display device DSP along the A-B line of FIG. 2.

Embodiments described herein aim to provide a manufacturing device of a display device and a manufacturing method of a display device such that the reduction in the production efficiency can be prevented.

In general, according to one embodiment, a manufacturing method of a display device comprises preparing a processing substrate by forming a lower electrode above a substrate, forming a rib comprising an aperture which overlaps the lower electrode, and forming a partition including a lower portion located on the rib and an upper portion which is located on the lower portion and protrudes from a side surface of the lower portion, forming an organic layer on the lower electrode in the aperture, forming an upper electrode on the organic layer, forming a first transparent layer on the upper electrode, and forming a second transparent layer having a refractive index which is lower than a refractive index of the first transparent layer on the first transparent layer. A process of forming the organic layer, the upper electrode, the first transparent layer and the second transparent layer is a deposition process using the partition as a mask. In the deposition process of forming at least one of the organic layer, the upper electrode, the first transparent layer and the second transparent layer, an evaporation source emits a material to the processing substrate and a film thickness measurement device, and the film thickness measurement device applies an acoustic impedance correction value which differs depending on a frequency of a crystal oscillator, and measures an evaporation rate based on an amount of change in the frequency of the crystal oscillator, and a controller controls the evaporation source such that the evaporation rate becomes constant.

According to another embodiment, a manufacturing device of a display device comprises a first evaporation portion which forms an organic layer while conveying a processing substrate comprising a lower electrode located above a substrate, a rib comprising an aperture which overlaps the lower electrode, and a partition including a lower portion located on the rib and an upper portion which is located on the lower portion and protrudes from a side surface of the lower portion, the organic layer being formed on the lower electrode in the aperture, a second evaporation portion which forms an upper electrode on the organic layer, a third evaporation portion which forms a first transparent layer on the upper electrode, and a fourth evaporation portion which forms, on the first transparent layer, a second transparent layer having a refractive index which is lower than a refractive index of the first transparent layer. At least one of the first evaporation portion, the second evaporation portion, the third evaporation portion and the fourth evaporation portion comprises an evaporation source comprising a first nozzle which faces a conveyance path of the processing substrate and a second nozzle provided on a side opposite to the first nozzle, a film thickness measurement device which comprises a crystal oscillator facing the second nozzle, holds a table of an acoustic impedance correction value which differs depending on a frequency of the crystal oscillator, and is configured to measure an evaporation rate based on an amount of change in the frequency of the crystal oscillator, and a control unit which controls the evaporation source such that the evaporation rate becomes constant.

The embodiments can provide a manufacturing device of a display device and a manufacturing method of a display device such that the reduction in the production efficiency can be prevented.

Embodiments will be described with reference to the accompanying drawings.

The disclosure is merely an example, and proper changes in keeping with the spirit of the invention, which are easily conceivable by a person of ordinary skill in the art, come within the scope of the invention as a matter of course. In addition, in some cases, in order to make the description clearer, the widths, thicknesses, shapes, etc., of the respective parts are illustrated schematically in the drawings, rather than as an accurate representation of what is implemented. However, such schematic illustration is merely exemplary, and in no way restricts the interpretation of the invention. In addition, in the specification and drawings, structural elements which function in the same or a similar manner to those described in connection with preceding drawings are denoted by like reference numbers, detailed description thereof being omitted unless necessary.

In the drawings, in order to facilitate understanding, an X-axis, a Y-axis and a Z-axis orthogonal to each other are shown depending on the need. A direction parallel to the X-axis is referred to as a first direction. A direction parallel to the Y-axis is referred to as a second direction. A direction parallel to the Z-axis is referred to as a third direction. When various types of elements are viewed parallel to the third direction Z, the appearance is referred to as a plan view. When terms indicating the positional relationships of two or more structural elements, such as "on", "above" "between" and "face", are used, the target structural elements may be directly in contact with each other or may be spaced apart from each other as a gap or another structural element is interposed between them. The positive direction of the Z-axis is referred to as "on" or "above".

The display device of the present embodiment is an organic electroluminescent display device comprising an organic light emitting diode (OLED) as a display element, and could be mounted on a television, a personal computer, a vehicle-mounted device, a tablet, a smartphone, a mobile phone, etc.

FIG. 1 is a diagram showing a configuration example of a display device DSP.

The display device DSP comprises a display area DA which displays an image and a surrounding area SA around the display area DA on an insulating substrate 10. The substrate 10 may be glass or a resinous film having flexibility.

In the present embodiment, the substrate 10 is rectangular as seen in plan view. It should be noted that the shape of the substrate 10 in plan view is not limited to a rectangle and may be another shape such as a square, a circle or an oval.

The display area DA comprises a plurality of pixels PX arrayed in matrix in a first direction X and a second direction Y. Each pixel PX includes a plurality of subpixels SP. For example, each pixel PX includes subpixel SP1 which exhibits a first color, subpixel SP2 which exhibits a second color and subpixel SP3 which exhibits a third color. The first color, the second color and the third color are different colors. Each pixel PX may include a subpixel SP which exhibits another color such as white in addition to subpixels SP1, SP2 and SP3 or instead of one of subpixels SP1, SP2 and SP3. It should be noted that the combination of subpixels is not limited to three elements. The combination may consist of two elements or may consist of four or more elements by adding subpixel SP4, etc., to subpixels SP1 to SP3.

Each subpixel SP comprises a pixel circuit 1 and a display element 20 driven by the pixel circuit 1. The pixel circuit 1 comprises a pixel switch 2, a drive transistor 3 and a capacitor 4. The pixel switch 2 and the drive transistor 3 are, for example, switching elements consisting of thin-film transistors.

The gate electrode of the pixel switch 2 is connected to a scanning line GL. One of the source electrode and drain electrode of the pixel switch 2 is connected to a signal line SL. The other one is connected to the gate electrode of the drive transistor 3 and the capacitor 4. In the drive transistor 3, one of the source electrode and the drain electrode is connected to a power line PL and the capacitor 4, and the other one is connected to the anode of the display element 20.

It should be noted that the configuration of the pixel circuit 1 is not limited to the example shown in the figure. For example, the pixel circuit 1 may comprise more thin-film transistors and capacitors.

The display element 20 is an organic light emitting diode (OLED) as a light emitting element, and may be called an organic EL element.

Although not described in detail, a terminal for connecting an IC chip and a flexible printed circuit is provided in the surrounding area SA.

FIG. 2 is a diagram showing an example of the layout of subpixels SP1, SP2 and SP3.

In the example of FIG. 2, subpixels SP2 and SP3 are arranged in the second direction Y. Subpixels SP1 and SP2 are arranged in the first direction X, and subpixels SP1 and SP3 are arranged in the first direction X.

When subpixels SP1, SP2 and SP3 are provided in line with this layout, in the display area DA, a column in which subpixels SP2 and SP3 are alternately provided in the second direction Y and a column in which a plurality of subpixels SP1 are provided in the second direction Y are formed. These columns are alternately arranged in the first direction X.

It should be noted that the layout of subpixels SP1, SP2 and SP3 is not limited to the example of FIG. 2. As another example, subpixels SP1, SP2 and SP3 in each pixel PX may be arranged in order in the first direction X.

A rib 5 and a partition 6 are provided in the display area DA. The rib 5 comprises apertures AP1, AP2 and AP3 in subpixels SP1, SP2 and SP3, respectively.

The partition 6 overlaps the rib 5 as seen in plan view. The partition 6 is formed into a grating shape surrounding the apertures AP1, AP2 and AP3 as a whole. In other words, the partition 6 comprises apertures in subpixels SP1, SP2 and SP3 in a manner similar to that of the rib 5.

Subpixels SP1, SP2 and SP3 comprise display elements 201, 202 and 203, respectively, as the display elements 20.

The display element 201 of subpixel SP1 comprises a lower electrode LE1, an upper electrode UE1 and an organic layer OR1 overlapping the aperture AP1. The peripheral portion of the lower electrode LE1 is covered with the rib 5. The organic layer OR1 and the upper electrode UE1 are surrounded by the partition 6. The peripheral portion of each of the organic layer OR1 and the upper electrode UE1 overlaps the rib 5 as seen in plan view. The organic layer OR1 includes a light emitting layer which emits light in, for example, a blue wavelength range.

The display element 202 of subpixel SP2 comprises a lower electrode LE2, an upper electrode UE2 and an organic layer OR2 overlapping the aperture AP2. The peripheral portion of the lower electrode LE2 is covered with the rib 5. The organic layer OR2 and the upper electrode UE2 are surrounded by the partition 6. The peripheral portion of each of the organic layer OR2 and the upper electrode UE2 overlaps the rib 5 as seen in plan view. The organic layer OR2 includes a light emitting layer which emits light in, for example, a green wavelength range.

The display element 203 of subpixel SP3 comprises a lower electrode LE3, an upper electrode UE3 and an organic layer OR3 overlapping the aperture AP3. The peripheral portion of the lower electrode LE3 is covered with the rib 5. The organic layer OR3 and the upper electrode UE3 are surrounded by the partition 6. The peripheral portion of each of the organic layer OR3 and the upper electrode UE3 overlaps the rib 5 as seen in plan view. The organic layer OR3 includes a light emitting layer which emits light in, for example, a red wavelength range.

In the example of FIG. 2, the outer shapes of the lower electrodes LE1, LE2 and LE3 are shown by dotted lines, and the outer shapes of the organic layers OR1, OR2 and OR3 and the upper electrodes UE1, UE2 and UE3 are shown by alternate long and short dash lines. It should be noted that the outer shape of each of the lower electrodes, organic layers and upper electrodes shown in the figure does not necessarily reflect the accurate shape.

The lower electrodes LE1, LE2 and LE3 correspond to, for example, the anodes of the display elements. The upper electrodes UE1, UE2 and UE3 correspond to the cathodes of the display elements or a common electrode.

The lower electrode LE1 is connected to the pixel circuit 1 (see FIG. 1) of subpixel SP1 through a contact hole CH1. The lower electrode LE2 is connected to the pixel circuit 1 of subpixel SP2 through a contact hole CH2. The lower electrode LE3 is connected to the pixel circuit 1 of subpixel SP3 through a contact hole CH3.

In the example of FIG. 2, the area of the aperture AP1, the area of the aperture AP2 and the area of the aperture AP3 are different from each other. The area of the aperture AP1 is greater than that of the aperture AP2, and the area of the aperture AP2 is greater than that of the aperture AP3. In other words, the area of the lower electrode LE1 exposed from the aperture AP1 is greater than that of the lower electrode LE2 exposed from the aperture AP2. The area of the lower electrode LE2 exposed from the aperture AP2 is greater than that of the lower electrode LE3 exposed from the aperture AP3.

FIG. 3 is a schematic cross-sectional view of the display device DSP along the A-B line of FIG. 2.

A circuit layer 11 is provided on the substrate 10. The circuit layer 11 includes various circuits such as the pixel circuit 1 shown in FIG. 1 and various lines such as the scanning line GL, the signal line SL and the power line PL. The circuit layer 11 is covered with an insulating layer 12. The insulating layer 12 functions as a planarization film which planarizes the irregularities formed by the circuit layer 11.

The lower electrodes LE1, LE2 and LE3 are provided on the insulating layer 12 and are spaced apart from each other. The rib 5 is provided on the insulating layer 12 and the lower electrodes LE1, LE2 and LE3. The aperture AP1 of the rib 5 overlaps the lower electrode LE1. The aperture AP2 overlaps the lower electrode LE2. The aperture AP3 overlaps the lower electrode LE3. The peripheral portions of the lower electrodes LE1, LE2 and LE3 are covered with the rib 5. Between, of the lower electrodes LE1, LE2 and LE3, the lower electrodes which are adjacent to each other, the insulating layer 12 is covered with the rib 5. The lower electrodes LE1, LE2 and LE3 are connected to the pixel circuits 1 of subpixels SP1, SP2 and SP3, respectively, through the contact holes provided in the insulating layer 12. It should be noted that, although the contact holes of the insulating layer 12 are omitted in FIG. 3, the contact holes correspond to the contact holes CH1, CH2 and CH3 of FIG. 2.

The partition 6 includes a conductive lower portion (stem) 61 provided on the rib 5 and an upper portion (cap) 62 provided on the lower portion 61. The lower portion 61 of the partition 6 shown on the left side of the figure is located between the aperture AP1 and the aperture AP2. The lower portion 61 of the partition 6 shown on the right side of the figure is located between the aperture AP2 and the aperture AP3. The upper portion 62 has a width greater than that of the lower portion 61. The both end portions of the upper portion 62 protrude relative to the side surfaces of the lower portion 61. This shape of the partition 6 is called an overhang shape.

The organic layer OR1 is in contact with the lower electrode LE1 through the aperture AP1 and covers the lower electrode LE1 exposed from the aperture AP1. The peripheral portion of the organic layer OR1 is located on the rib 5. The upper electrode UE1 covers the organic layer OR1 and is in contact with the lower portion 61.

The organic layer OR2 is in contact with the lower electrode LE2 through the aperture AP2 and covers the lower electrode LE2 exposed from the aperture AP2. The peripheral portion of the organic layer OR2 is located on the rib 5. The upper electrode UE2 covers the organic layer OR2 and is in contact with the lower portion 61.

The organic layer OR3 is in contact with the lower electrode LE3 through the aperture AP3 and covers the lower electrode LE3 exposed from the aperture AP3. The peripheral portion of the organic layer OR3 is located on the rib 5. The upper electrode UE3 covers the organic layer OR3 and is in contact with the lower portion 61.

In the example of FIG. 3, subpixel SP1 comprises a cap layer CP1 and a sealing layer SE1. Subpixel SP2 comprises a cap layer CP2 and a sealing layer SE2. Subpixel SP3 comprises a cap layer CP3 and a sealing layer SE3. The cap layers CP1, CP2 and CP3 function as optical adjustment layers which improve the extraction efficiency of the light emitted from the organic layers OR1, OR2 and OR3, respectively.

The cap layer CP1 is provided on the upper electrode UE1.

The cap layer CP2 is provided on the upper electrode UE2.

The cap layer CP3 is provided on the upper electrode UE3.

The sealing layer SE1 is provided on the cap layer CP1, is in contact with the partition 6 and continuously covers each member of subpixel SP1.

The sealing layer SE2 is provided on the cap layer CP2, is in contact with the partition 6 and continuously covers each member of subpixel SP2.

The sealing layer SE3 is provided on the cap layer CP3, is in contact with the partition 6 and continuously covers each member of subpixel SP3.

In the example of FIG. 3, each of the organic layer OR1, the upper electrode UE1 and the cap layer CP1 is partly located on the partition 6 around subpixel SP1. These portions are spaced apart from, of the organic layer OR1, the upper electrode UE1 and the cap layer CP1, the portions located in the aperture AP1 (the portions constituting the display element 201).

Similarly, each of the organic layer OR2, the upper electrode UE2 and the cap layer CP2 is partly located on the partition 6 around subpixel SP2. These portions are spaced apart from, of the organic layer OR2, the upper electrode UE2 and the cap layer CP2, the portions located in the aperture AP2 (the portions constituting the display element 202).

Similarly, each of the organic layer OR3, the upper electrode UE3 and the cap layer CP3 is partly located on the partition 6 around subpixel SP3. These portions are spaced apart from, of the organic layer OR3, the upper electrode UE3 and the cap layer CP3, the portions located in the aperture AP3 (the portions constituting the display element 203).

The end portions of the sealing layers SE1, SE2 and SE3 are located above the partition 6. In the example of FIG. 3, the end portions of the sealing layers SE1 and SE2 located above the partition 6 between subpixels SP1 and SP2 are spaced apart from each other. The end portions of the sealing layers SE2 and SE3 located above the partition 6 between subpixels SP2 and SP3 are spaced apart from each other.

The sealing layers SE1, SE2 and SE3 are covered with a resin layer 13. The resin layer 13 is covered with a sealing layer 14. The sealing layer 14 is covered with a resin layer 15.

The rib 5 is formed of, for example, an inorganic insulating material such as silicon nitride (SiNx), silicon oxide (SiOx), silicon oxynitride (SiON) or aluminum oxide ($Al_2O_3$).

Each of the sealing layers SE1, SE2 and SE3 and the sealing layer 14 is formed of, for example, silicon nitride (SiNx). Each of the sealing layers SE1, SE2 and SE3 and the sealing layer 14 may be formed of another inorganic insulating material such as silicon oxide (SiOx), silicon oxynitride (SiON) or aluminum oxide ($Al_2O_3$).

For example, the rib 5 is formed of a material which is different from the materials of the sealing layers SE1, SE2 and SE3. It should be noted that the rib 5 could be formed of the same material as the sealing layers SE1, SE2 and SE3.

The lower portion 61 of the partition 6 is formed of a conductive material and is electrically connected to the upper electrodes UE1, UE2 and UE3. The upper portion 62 of the partition 6 is formed of, for example, a conductive material. However, the upper portion 62 may be formed of an insulating material. The lower portion 61 is formed of a material which is different from that of the upper portion 62.

For example, each of the lower electrodes LE1, LE2 and LE3 is a multilayer body including a transparent electrode formed of an oxide conductive material such as indium tin oxide (ITO) and a metal electrode formed of a metal material such as silver.

The organic layer OR1 includes a light emitting layer EM1. The organic layer OR2 includes a light emitting layer EM2. The organic layer OR3 includes a light emitting layer EM3. The light emitting layer EM1, the light emitting layer EM2 and the light emitting layer EM3 are formed of materials which are different from each other. For example, the light emitting layer EM1 is formed of a material which emits light in a blue wavelength range. The light emitting layer EM2 is formed of a material which emits light in a green wavelength range. The light emitting layer EM3 is formed of a material which emits light in a red wavelength range.

Each of the organic layers OR1, OR2 and OR3 includes a plurality of functional layers such as a hole injection layer, a hole transport layer, an electron blocking layer, a hole blocking layer, an electron transport layer and an electron injection layer.

Each of the upper electrodes UE1, UE2 and UE3 is formed of, for example, a metal material such as an alloy of magnesium and silver (MgAg).

Each of the cap layers CP1, CP2 and CP3 is a multilayer body consisting of a plurality of thin films. All of the thin films are transparent and have refractive indices different from each other.

Figure 4:
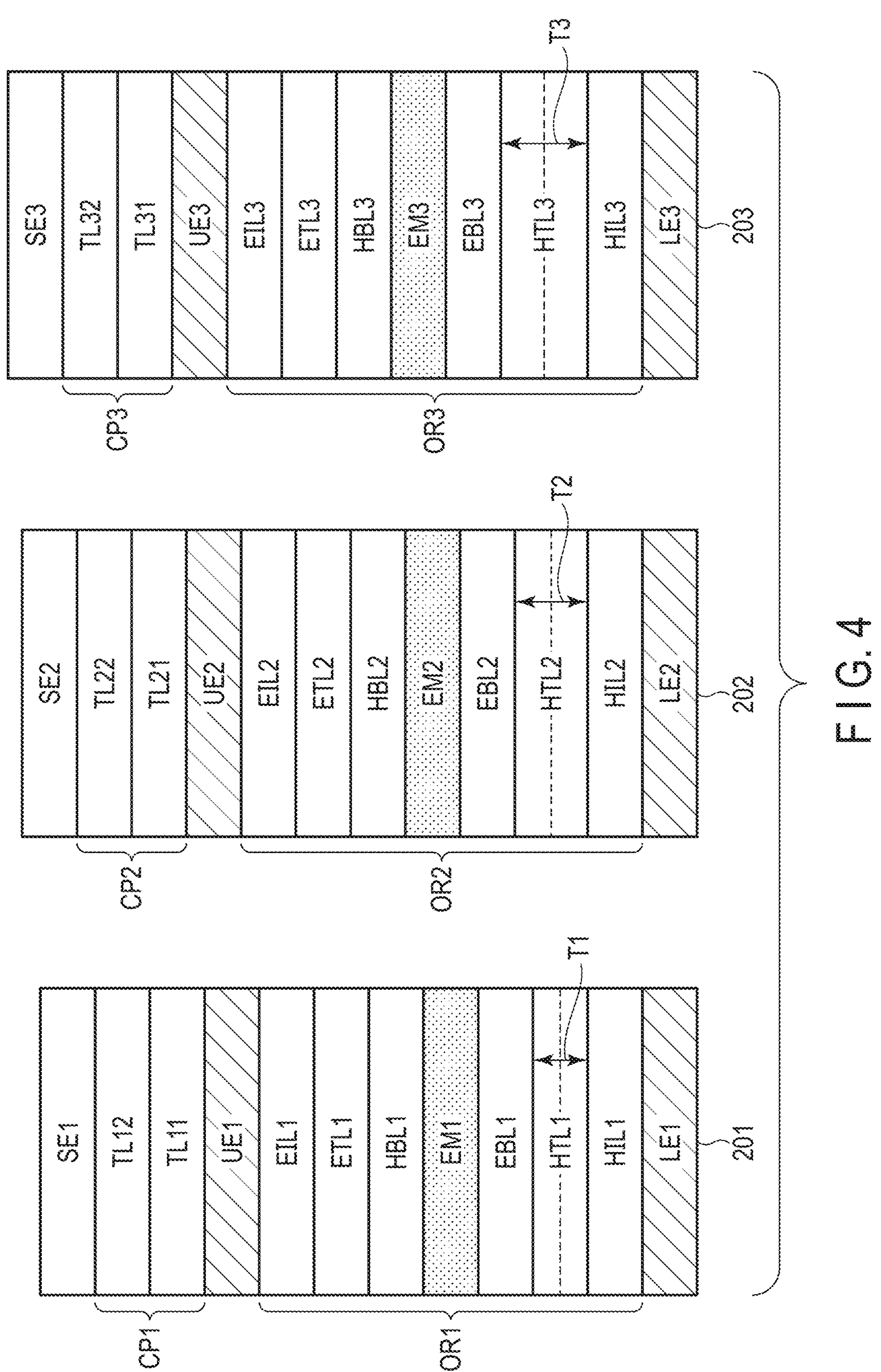
FIG. 4 is a diagram showing an example of the configuration of display elements 201 to 203.

FIG. 4 is a diagram showing an example of the configuration of the display elements 201 to 203.

Here, in the example, this specification assumes that each lower electrode corresponds to an anode and each upper electrode corresponds to a cathode.

The display element 201 includes the organic layer OR1 between the lower electrode LE1 and the upper electrode UE1.

In the organic layer OR1, a hole injection layer HIL1, a hole transport layer HTL1, an electron blocking layer EBL1, the light emitting layer EM1, a hole blocking layer HBL1, an electron transport layer ETL1 and an electron injection layer EIL1 are stacked in this order.

The cap layer CP1 includes a first transparent layer TL11 and a second transparent layer TL12. The first transparent layer TL11 is provided on the upper electrode UE1. The second transparent layer TL12 is provided on the first transparent layer TL11. The sealing layer SE1 is provided on the second transparent layer TL12.

The display element 202 includes the organic layer OR2 between the lower electrode LE2 and the upper electrode UE2.

In the organic layer OR2, a hole injection layer HIL2, a hole transport layer HTL2, an electron blocking layer EBL2, the light emitting layer EM2, a hole blocking layer HBL2, an electron transport layer ETL2 and an electron injection layer EIL2 are stacked in this order. For example, thickness T2 of the hole transport layer HTL2 is greater than thickness T1 of the hole transport layer HTL1.

The cap layer CP2 includes a first transparent layer TL21 and a second transparent layer TL22. The first transparent layer TL21 is provided on the upper electrode UE2. The second transparent layer TL22 is provided on the first transparent layer TL21. The sealing layer SE2 is provided on the second transparent layer TL22.

The display element 203 includes the organic layer OR3 between the lower electrode LE3 and the upper electrode UE3.

In the organic layer OR3, a hole injection layer HIL3, a hole transport layer HTL3, an electron blocking layer EBL3, the light emitting layer EM3, a hole blocking layer HBL3, an electron transport layer ETL3 and an electron injection layer EIL3 are stacked in this order. For example, thickness T3 of the hole transport layer HTL3 is greater than thickness T2 of the hole transport layer HTL2.

The cap layer CP3 includes a first transparent layer TL31 and a second transparent layer TL32. The first transparent layer TL31 is provided on the upper electrode UE3. The second transparent layer TL32 is provided on the first transparent layer TL31. The sealing layer SE3 is provided on the second transparent layer TL32.

The first transparent layers TL11, TL21 and TL31 are, for example, transparent organic layers each formed of an organic material, and are high refractive layers having refractive indices greater than those of the upper electrodes UE1, UE2 and UE3. For example, the refractive index of each of the first transparent layers TL11, TL21 and TL31 is greater than or equal to 1.7 and less than or equal to 2.0.

The second transparent layers TL12, TL22 and TL32 are, for example, transparent organic layers each formed of an organic material, and are low refractive layers having refractive indices less than those of the first transparent layers TL11, TL21 and TL31. For example, the refractive index of each of the second transparent layers TL12, TL22 and TL32 is greater than or equal to 1.3 and less than or equal to 1.6.

The refractive indices of the sealing layers SE1, SE2 and SE3 which are in contact with the second transparent layers TL12, TL22 and TL32 are greater than those of the second transparent layers TL12, TL22 and TL32. For example, the refractive index of each of the sealing layers SE1, SE2 and SE3 is greater than or equal to 1.7 and less than or equal to 2.0.

As the organic material for forming the second transparent layers TL12, TL22 and TL32, fluorine resin in which the main chain consists of carbon and which contains fluorine in a substituent is desirable. For example, each of the second transparent layers TL12, TL22 and TL32 can be formed of at least one organic material from polytetrafluoroethylene (PTFE), polyvinylidene fluoride (PVDF) and 2-(perfluorohexyl)ethyl acrylate. The refractive index of polytetrafluoroethylene is 1.35. The refractive index of polyvinylidene fluoride is 1.42. The refractive index of 2-(perfluorohexyl) ethyl acrylate is 1.35.

The second transparent layers TL12, TL22 and TL32 to which these organic materials are applied can be formed by a vapor deposition method. The thickness of each of these second transparent layers TL12, TL22 and TL32 is, for example, 20 nm to 500 nm.

The first transparent layers TL11, TL21 and TL31 are spaced apart from each other and are individually formed. Thus, all of the first transparent layers TL11, TL21 and TL31 could be formed of the same material or could be formed of different materials.

The second transparent layers TL12, TL22 and TL32 are spaced apart from each other and are individually formed. Thus, all of the second transparent layers TL12, TL22 and TL32 could be formed of the same material or could be formed of different materials.

All of the thicknesses of the first transparent layers TL11, TL21 and TL31 could be the same as each other, or could be different from each other.

All of the thicknesses of the second transparent layers TL12, TL22 and TL32 could be the same as each other, or could be different from each other.

For example, all of the thicknesses of the second transparent layers TL12, TL22 and TL32 are the same as each other. The thickness of the first transparent layer TL11 in the display element 201 for blue is less than that of the first transparent layer TL31 in the display element 203 for red.

In the display element 201, the thickness of the second transparent layer TL12 is greater than that of the first transparent layer TL11. In the display element 203, the thickness of the first transparent layer TL31 is less than that of the second transparent layer TL32.

All of the layer configurations of the cap layers CP1 to CP3 could be the same as each other or could be different from each other.

Each of the cap layers CP1, CP2 and CP3 may be a stacked layer body consisting of three or more layers.

It should be noted that each of the organic layers OR1, OR2 and OR3 may include, in addition to the functional layers described above, other functional layers such as a carrier generation layer as needed, or at least one of the above functional layers may be omitted.

For example, each of the hole transport layers HTL1, HTL2 and HTL3 is a multilayer body consisting of two thin films formed of materials different from each other as shown by dotted lines in the figure. However, each of the hole transport layers HTL1, HTL2 and HLT3 may be a single-layer body formed of a single material.

Each of the display elements 201 to 203 is not limited to the single configuration shown in the figure and may comprise a tandem configuration.

Now, this specification explains the manufacturing method of the display device DSP with reference to FIG. 5 to FIG. 11. In FIG. 5 to FIG. 11, the illustration of the lower side of the insulating layer 12 is omitted.

Figure 5:
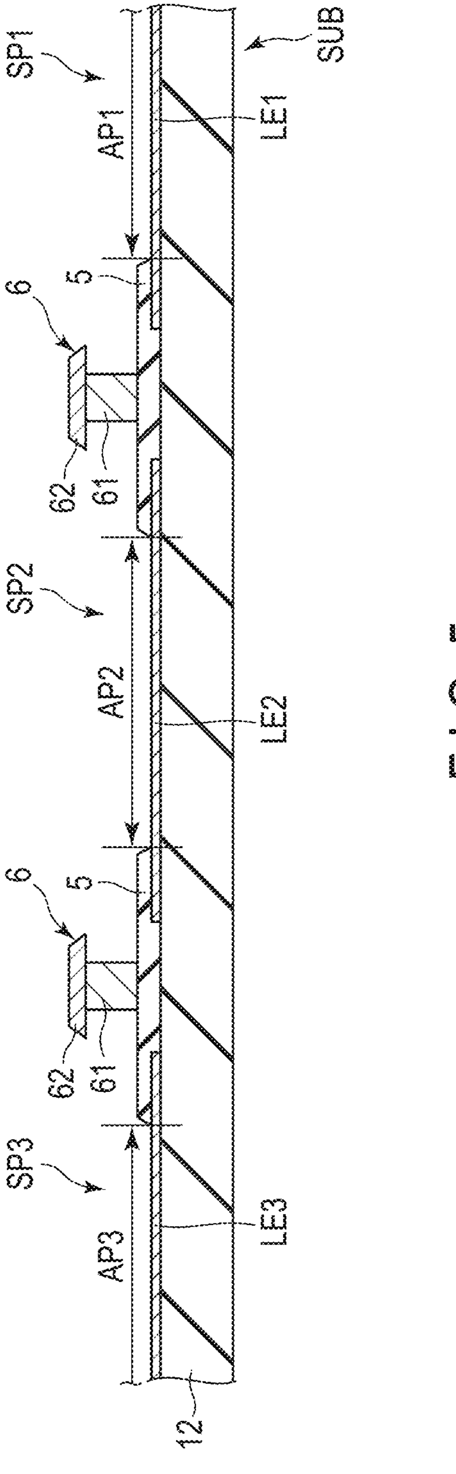
FIG. 5 is a diagram for explaining the manufacturing method of the display device DSP.

First, as shown in FIG. 5, a processing substrate SUB is prepared. The process of preparing the processing substrate SUB includes the process of forming the lower electrode LE1 of subpixel SP1, the lower electrode LE2 of subpixel SP2 and the lower electrode LE3 of subpixel SP3 on the insulating layer 12, the process of forming the rib 5 comprising the apertures AP1, AP2 and AP3 overlapping the lower electrodes LE1, LE2 and LE3, respectively, and the process of forming the partition 6 including the lower portion 61 provided on the rib 5 and the upper portion 62 provided on the lower portion 61 and protruding from the side surfaces of the lower portion 61. The rib 5 is formed of, for example, silicon oxynitride. Of the partition 6, at least the lower portion 61 is formed of a conductive material. It should be noted that the partition 6 may be formed after the formation of the rib 5 comprising the apertures AP1, AP2 and AP3. Alternatively, the apertures AP1, AP2 and AP3 may be formed after the formation of the partition 6.

Subsequently, the display element 201 is formed.

First, as shown in FIG. 6, the organic layer OR1 is formed by depositing the materials for forming the hole injection layer, the hole transport layer, the electron blocking layer, the light emitting layer (EM1), the hole blocking layer, the electron transport layer, the electron injection layer, etc., on the lower electrode LE1 in series using the partition 6 as a mask.

Subsequently, the upper electrode UE1 is formed by depositing a mixture of magnesium and silver on the organic layer OR1 using the partition 6 as a mask. The upper electrode UE1 covers the organic layer OR1 and is in contact with the lower portion 61.

Subsequently, the cap layer CP1 is formed by depositing a high-refractive material for forming the first transparent layer TL11 and a low-refractive material for forming the second transparent layer TL12 in series on the upper electrode UE1 using the partition 6 as a mask.

Subsequently, the sealing layer SE1 is formed so as to continuously cover the cap layer CP1 and the partition 6 by depositing an inorganic insulating material by CVD. Here, to the inorganic insulating material having a refractive index which is higher than that of the second transparent layer TL12, for example, silicon nitride (SiN) is applied.

The organic layer OR1, the upper electrode UE1, the cap layer CP1 and the sealing layer SE1 are formed in at least the entire display area DA and are provided in subpixels SP2 and SP3 as well as subpixel SP1. The organic layer OR1, the upper electrode UE1 and the cap layer CP1 are divided by the partition 6 having an overhang shape.

The materials which are emitted from an evaporation source when the organic layer OR1, the upper electrode UE1 and the cap layer CP1 (including the first transparent layer TL11 and the second transparent layer TL12) are formed by vapor deposition are blocked by the upper portion 62. Thus, each of the organic layer OR1, the upper electrode UE1 and the cap layer CP1 is partly stacked on the upper portion 62. The organic layer OR1, upper electrode UE1 and cap layer CP1 located on the upper portion 62 are spaced apart from the organic layer OR1, upper electrode UE1 and cap layer CP1 located immediately above the lower electrode LE1.

The sealing layer SE1 covers the cap layer CP1 of the partition 6, covers the cap layer CP1 located immediately above the lower electrode LE1 and is in contact with the partition 6.

Figure 7:
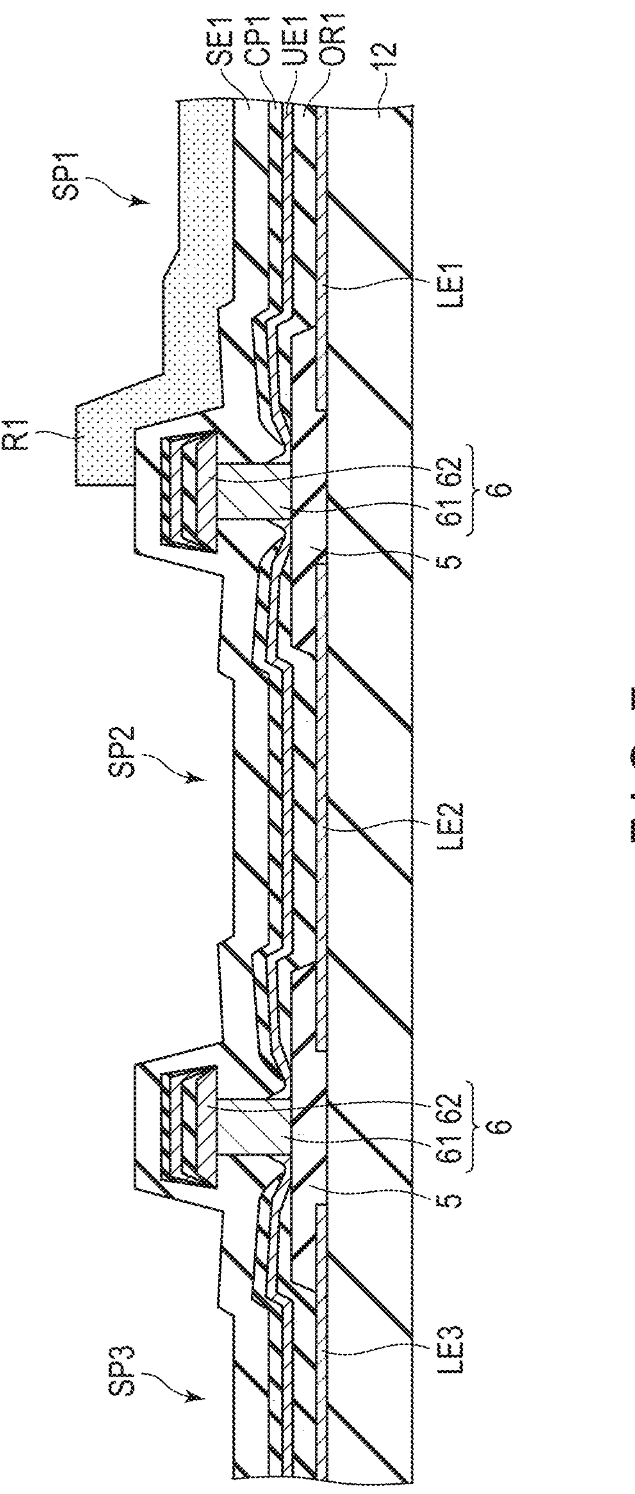
FIG. 7 is a diagram for explaining the manufacturing method of the display device DSP.

Subsequently, as shown in FIG. 7, a resist R1 patterned into a predetermined shape is formed on the sealing layer SE1. The resist R1 overlaps subpixel SP1 and part of the partition 6 around subpixel SP1.

Figure 8:
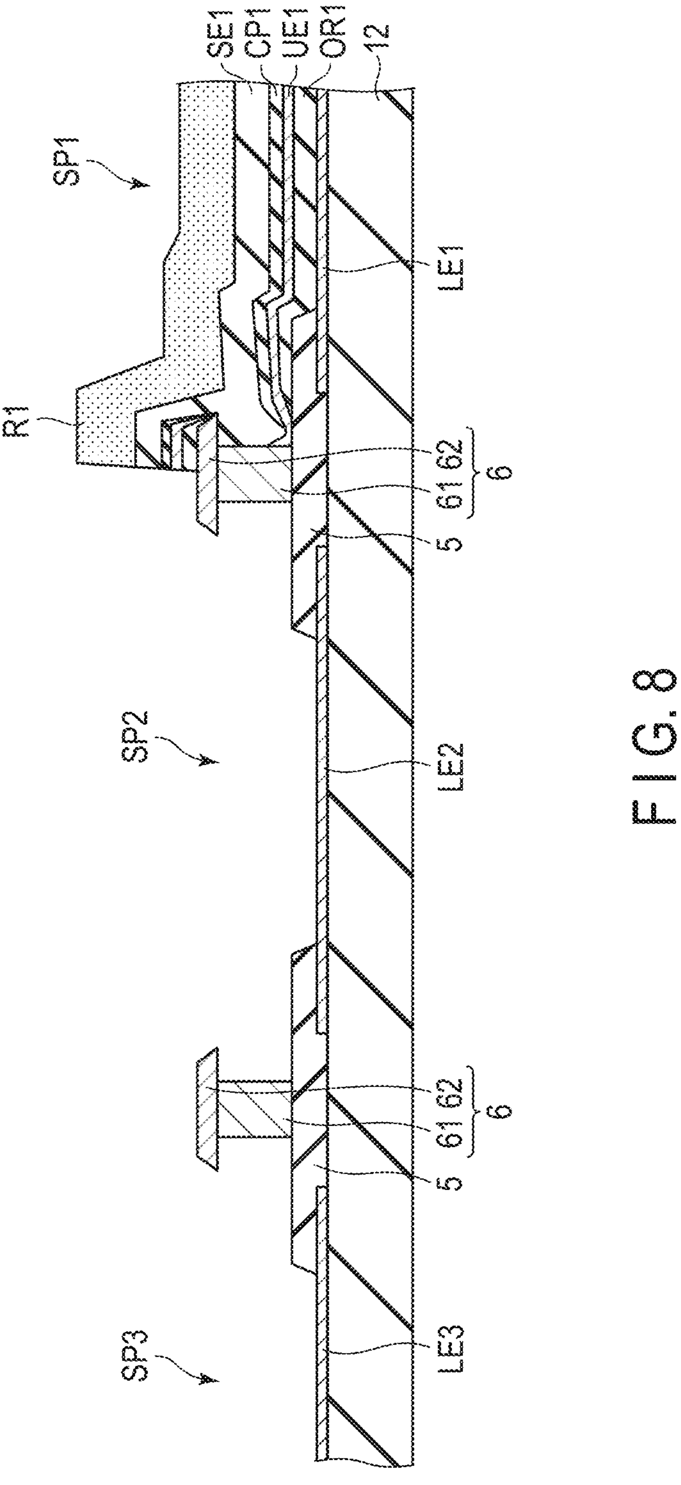
FIG. 8 is a diagram for explaining the manufacturing method of the display device DSP.

Subsequently, as shown in FIG. 8, the sealing layer SE1, cap layer CP1, upper electrode UE1 and organic layer OR1 exposed from the resist R1 are removed in series by performing etching using the resist R1 as a mask. In this manner, the lower electrode LE2 of subpixel SP2 and the lower electrode LE3 of subpixel SP3 are exposed.

Figure 9:
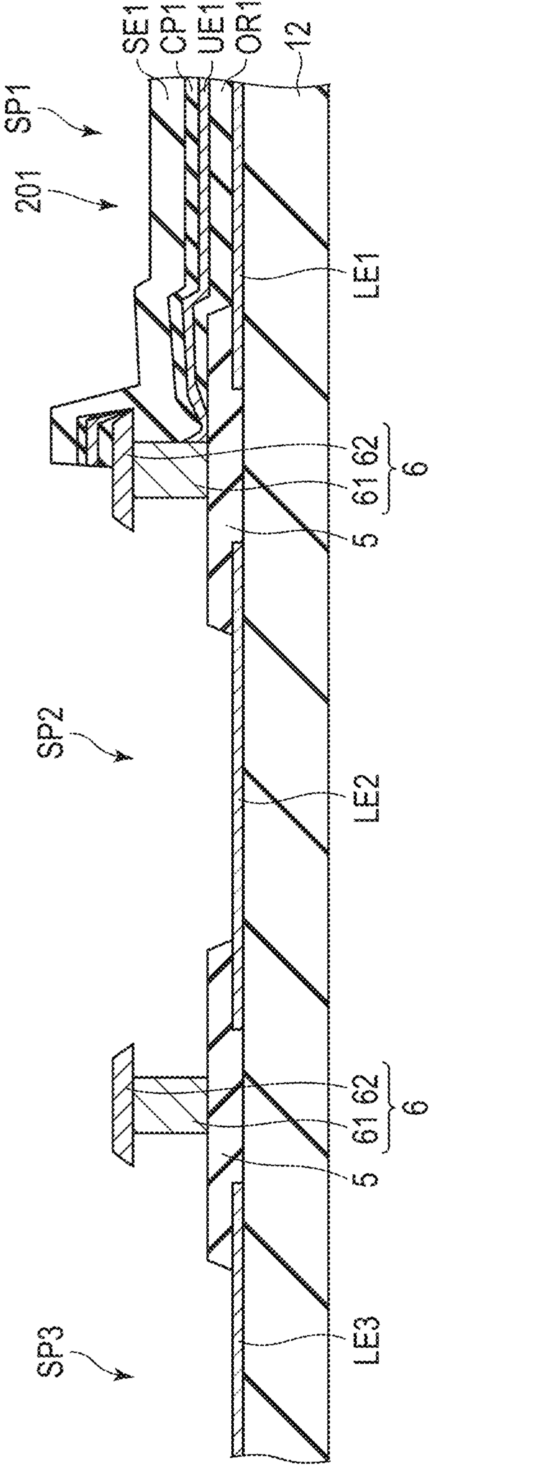
FIG. 9 is a diagram for explaining the manufacturing method of the display device DSP.

Subsequently, as shown in FIG. 9, the resist R1 is removed. By this process, the display element 201 is formed in subpixel SP1.

Figure 10:
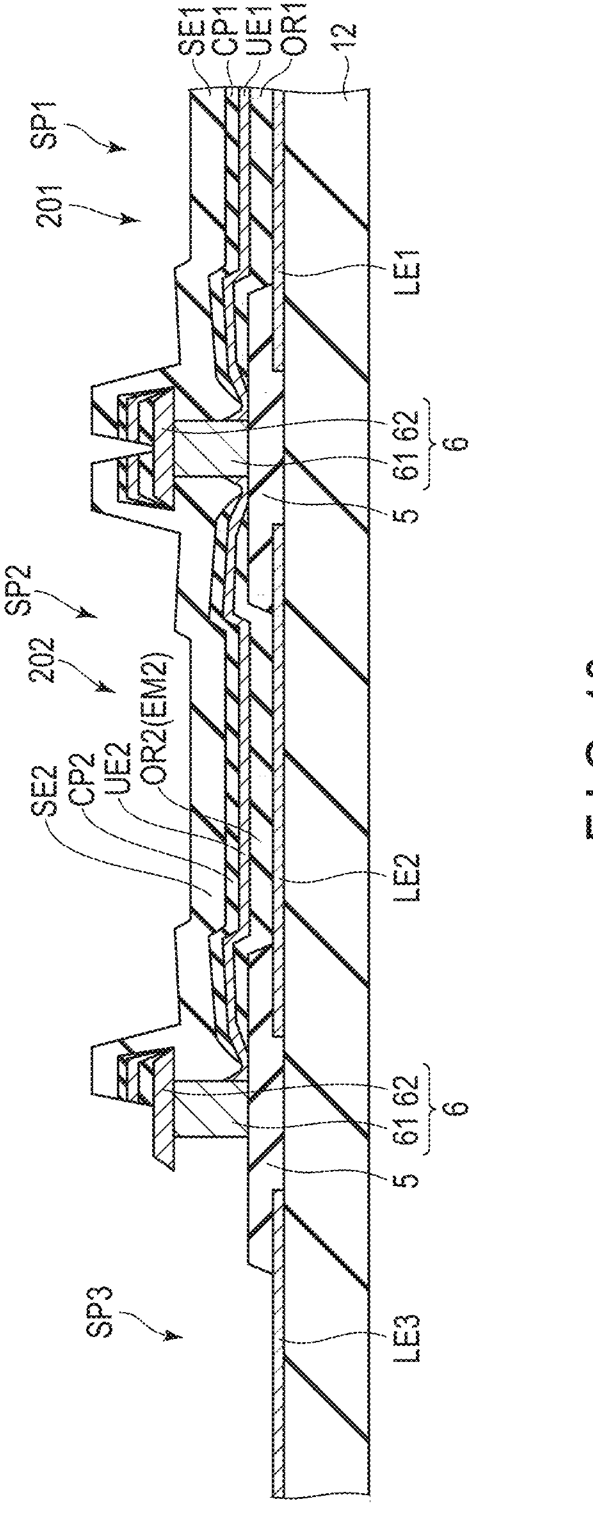
FIG. 10 is a diagram for explaining the manufacturing method of the display device DSP.

Subsequently, as shown in FIG. 10, the display element 202 is formed. The procedure of forming the display element 202 is similar to that of forming the display element 201. Specifically, the organic layer OR2 including the light emitting layer EM2, the upper electrode UE2, the cap layer CP2 including the first transparent layer TL21 and the second transparent layer TL22 and the sealing layer SE2 are formed in order on the lower electrode LE2. Subsequently, a resist is formed on the sealing layer SE2. The sealing layer SE2, the cap layer CP2, the upper electrode UE2 and the organic layer OR2 are patterned in series by performing etching using the resist as a mask. After this patterning, the resist is removed. In this manner, the display element 202 is formed in subpixel SP2, and the lower electrode LE3 of subpixel SP3 is exposed.

Figure 11:
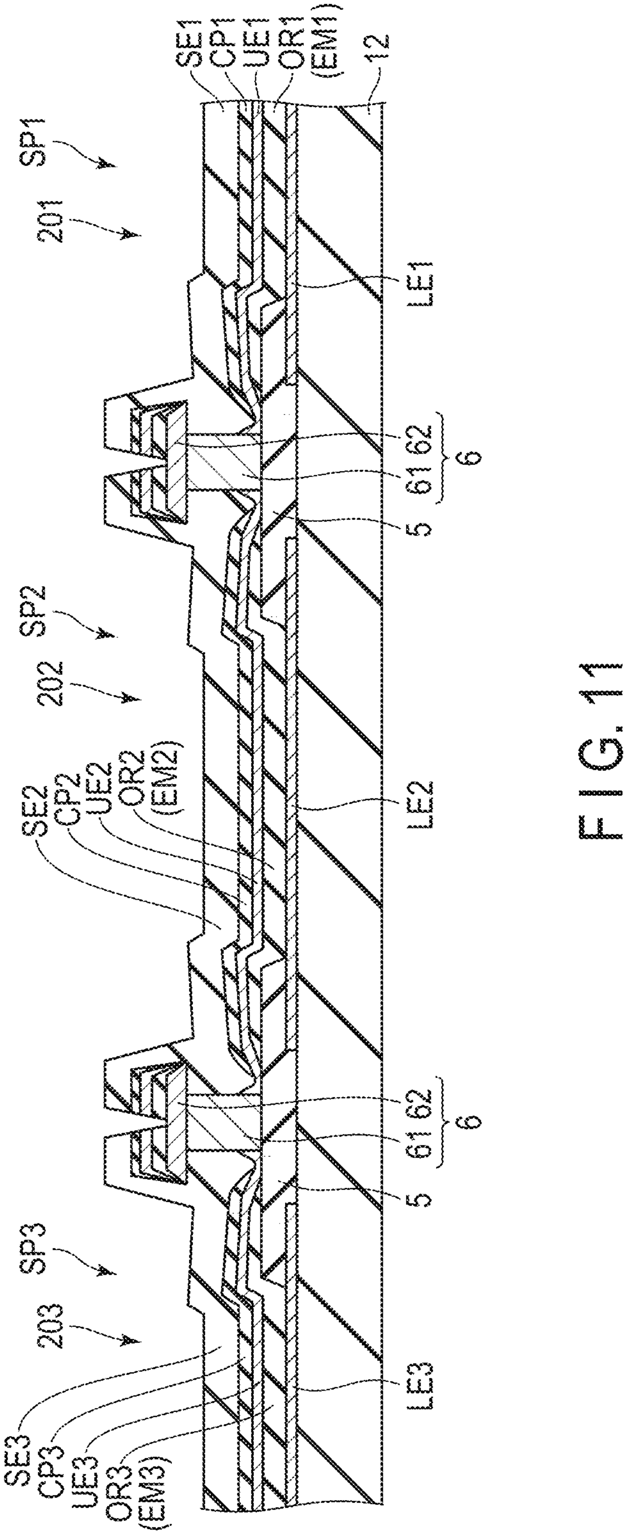
FIG. 11 is a diagram for explaining the manufacturing method of the display device DSP.

Subsequently, as shown in FIG. 11, the display element 203 is formed. The procedure of forming the display element 203 is similar to that of forming the display element 201. Specifically, the organic layer OR3 including the light emitting layer EM3, the upper electrode UE3, the cap layer CP3 including the first transparent layer TL31 and the second transparent layer TL32 and the sealing layer SE3 are formed in order on the lower electrode LE3. Subsequently, a resist is formed on the sealing layer SE3. The sealing layer SE3, the cap layer CP3, the upper electrode UE3 and the organic layer OR3 are patterned in series by performing etching using the resist as a mask. After this patterning, the resist is removed. By this process, the display element 203 is formed in subpixel SP3.

Subsequently, the resin layer 13, sealing layer 14 and resin layer 15 shown in FIG. 3 are formed in order. By this process, the display device DSP is completed.

In the manufacturing process described above, this specification assumes a case where the display element 201 is formed firstly, and the display element 202 is formed secondly, and the display element 203 is formed lastly. However, the formation order of the display elements 201, 202 and 203 is not limited to this example.

Now, the manufacturing device of the display device DSP is explained. Here, for example, this specification explains a manufacturing device 100 for forming the organic layer OR1, upper electrode UE1 and cap layer CP1 of the display element 201. It should be noted that a manufacturing device for forming the organic layer OR2, upper electrode UE2 and cap layer CP2 of the display element 202 and a manufacturing device for forming the organic layer OR3, upper electrode UE3 and cap layer CP3 of the display element 203 can be configured in the same manner as the manufacturing device 100 explained here.

Figure 12:
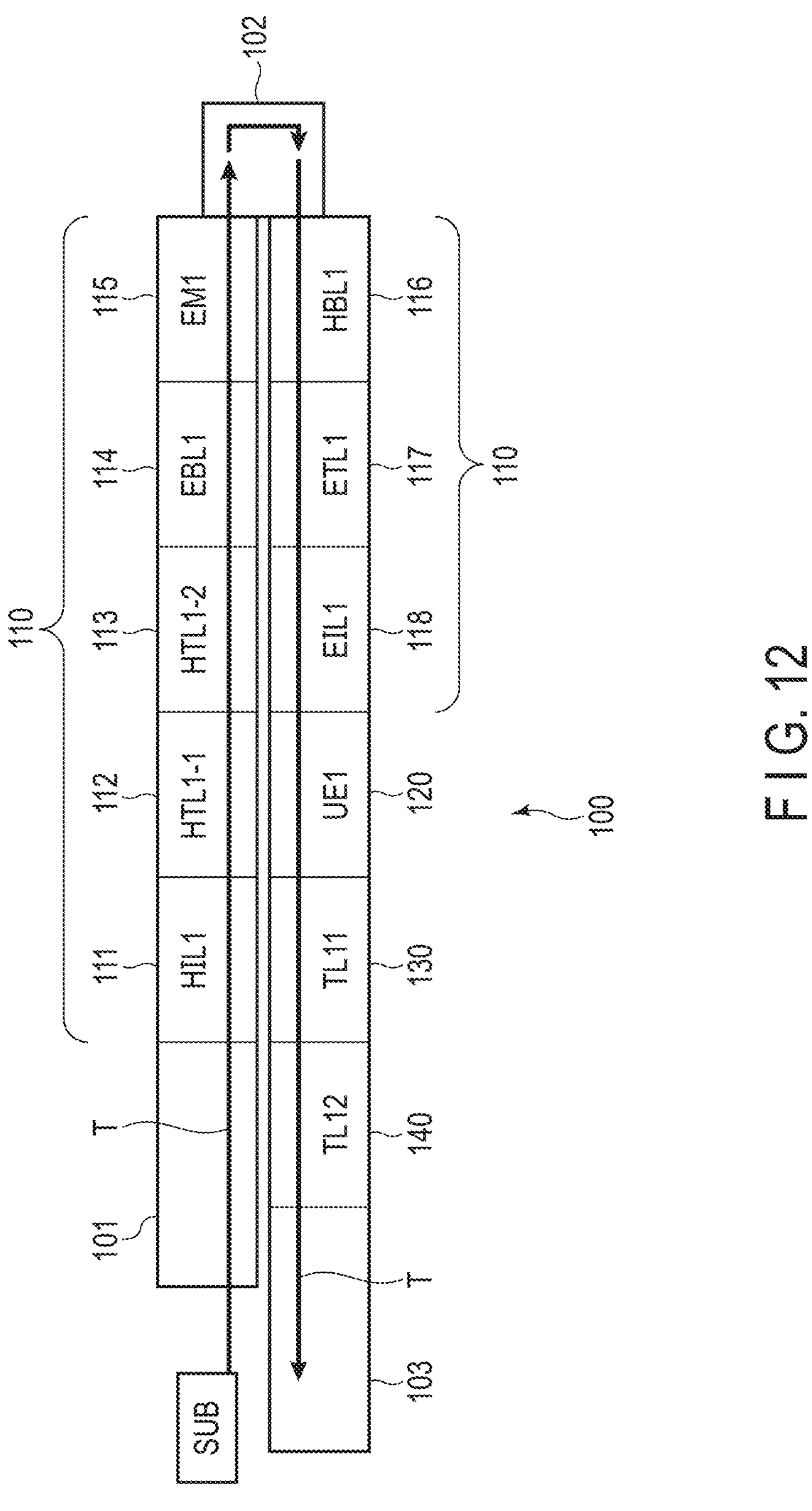
FIG. 12 is a diagram for explaining a configuration example of a manufacturing device 100.

FIG. 12 is a diagram for explaining a configuration example of the manufacturing device 100.

The manufacturing device 100 is applied to the process of forming the organic layer OR1, the upper electrode UE1 and the cap layer CP1 in the process of forming various thin films explained with reference to FIG. 6. It is assumed that the configuration of the display element 201 is the single configuration shown in FIG. 4.

The manufacturing device 100 comprises a preprocessing portion 101, a direction conversion portion 102, a post-processing portion 103, a first evaporation portion 110, a second evaporation portion 120, a third evaporation portion 130, a fourth evaporation portion 140, and a conveyance mechanism which conveys the processing substrate SUB along a conveyance path T. In the manufacturing device 100, at least the first evaporation portion 110 to the fourth evaporation portion 140 are maintained in a predetermined reduced-pressure state.

For example, the preprocessing portion 101 comprises a processing substrate formation portion which forms the processing substrate SUB comprising the lower electrodes, rib, partition, etc., explained with reference to FIG. 5, and a processing portion which performs various processes for the processing substrate SUB such as a cleaning process, a drying process and a plasma process. The preprocessing portion 101 comprises a mechanism which sets the processing substrate SUB so as to be in a predetermined conveyance posture, a mechanism which secures the processing substrate SUB to a dedicated carrier by an electrostatic chuck, etc. The carrier is conveyed along the conveyance path T by the conveyance mechanism.

The post-processing portion 103 comprises a mechanism which releases the securing applied by the electrostatic chuck and removes the processing substrate SUB from the carrier, a mechanism which sets the processing substrate SUB so as to be in a predetermined posture, etc.

The first evaporation portion 110 is configured to form the organic layer OR1 shown in FIG. 4 and comprises a plurality of evaporation portions. In the example shown in the figure, the first evaporation portion 110 comprises eight evaporation portions 111 to 118. However, the first evaporation portion 110 may comprise nine or more evaporation portions or may comprise seven or less evaporation portions.

The evaporation portions 111 to 115 are arranged in line along the conveyance path T. The evaporation portions 116 to 118 are arranged in line along the conveyance path T. The evaporation portion 115 and the evaporation portion 116 are connected to the direction conversion portion 102. In the example shown in the figure, the direction conversion portion 102 is configured to convert the conveyance direction of the processing substrate SUB 180°.

The evaporation portion 111 is configured to form the hole injection layer HIL1 on the lower electrode LE1.

The evaporation portion 112 is configured to form the first thin film HTL1-1 of the hole transport layer HTL1 on the hole injection layer HIL1.

The evaporation portion 113 is configured to form the second thin film HTL1-2 of the hole transport layer HTL1 on the first thin film HTL1-1. Here, two evaporation portions 112 and 113 are applied to form the hole transport layer HTL1 having a predetermined thickness T1. When the hole transport layer HTL1 having a predetermined thickness T1 can be formed by the single evaporation portion 112, the evaporation portion 113 is omitted.

The evaporation portion 114 is configured to form the electron blocking layer EBL1 on the second thin film HTL1-2.

The evaporation portion 115 is configured to form the light emitting layer EM11 on the electron blocking layer EBL1.

The evaporation portion 116 is configured to form the hole blocking layer HBL1 on the light emitting layer EM1.

The evaporation portion 117 is configured to form the electron transport layer ETL1 on the hole blocking layer HBL1.

The evaporation portion 118 is configured to form the electron injection layer EIL1 on the electron transport layer ETL1.

The second evaporation portion 120 is configured to form the upper electrode UE1 on the electron injection layer EIL1.

The third evaporation portion 130 is configured to deposit an organic material on the upper electrode UE1 and form the first transparent layer TL11.

The fourth evaporation portion 140 is configured to deposit an organic material on the first transparent layer TL11 and form the second transparent layer TL12.

This specification hereinafter explains a manufacturing process in the manufacturing device 100.

The processing substrate SUB which has been carried into the manufacturing device 100 is conveyed along the conveyance path T and is firstly carried into the preprocessing portion 101. In the preprocessing portion 101, a predetermined preprocess is performed for the processing substrate SUB.

Subsequently, the processing substrate SUB is carried into the evaporation portion 111. In the evaporation portion 111, an organic material for forming the hole injection layer HIL1 is deposited on the processing substrate SUB.

Subsequently, the processing substrate SUB is carried into the evaporation portion 112. In the evaporation portion 112, an organic material for forming the first thin film HTL1-1 of the hole transport layer is deposited on the processing substrate SUB.

Subsequently, the processing substrate SUB is carried into the evaporation portion 113. In the evaporation portion 113, an organic material for forming the second thin film HTL1-2 of the hole transport layer is deposited on the processing substrate SUB.

Subsequently, the processing substrate SUB is carried into the evaporation portion 114. In the evaporation portion 114, an organic material for forming the electron blocking layer EBL1 is deposited on the processing substrate SUB.

Subsequently, the processing substrate SUB is carried into the evaporation portion 115. In the evaporation portion 115, an organic material for forming the light emitting layer EM1 is deposited on the processing substrate SUB.

Subsequently, the processing substrate SUB is carried into the evaporation portion 116 via the direction conversion portion 102. In the evaporation portion 116, an organic material for forming the hole blocking layer HBL1 is deposited on the processing substrate SUB.

Subsequently, the processing substrate SUB is carried into the evaporation portion 117. In the evaporation portion 117, an organic material for forming the electron transport layer ETL1 is deposited on the processing substrate SUB.

In the evaporation portions 111 to 117, organic materials different from each other are deposited on the processing substrate SUB.

Subsequently, the processing substrate SUB is carried into the evaporation portion 118. In the evaporation portion 118, an inorganic material for forming the electron injection layer EIL1 is deposited on the processing substrate SUB.

Subsequently, the processing substrate SUB is carried into the second evaporation portion 120. In the second evaporation portion 120, a conductive material for forming the upper electrode UE1 is deposited on the processing substrate SUB.

Subsequently, the processing substrate SUB is carried into the third evaporation portion 130. In the third evaporation portion 130, an organic material for forming the first transparent layer TL11 is deposited on the processing substrate SUB.

Subsequently, the processing substrate SUB is carried into the fourth evaporation portion 140. In the fourth evaporation portion 140, an organic material for forming the second transparent layer TL12 is deposited on the processing substrate SUB.

In the third evaporation portion 130 and the fourth evaporation portion 140, organic materials different from each other are deposited on the processing substrate SUB.

Subsequently, the processing substrate SUB is carried into the post-processing portion 103. In the post-processing portion 103, a predetermined post-process is performed for the processing substrate SUB. Subsequently, the processing substrate SUB is carried out of the manufacturing device 100.

Now, this specification explains the typical configuration of evaporation portions.

Figure 13:
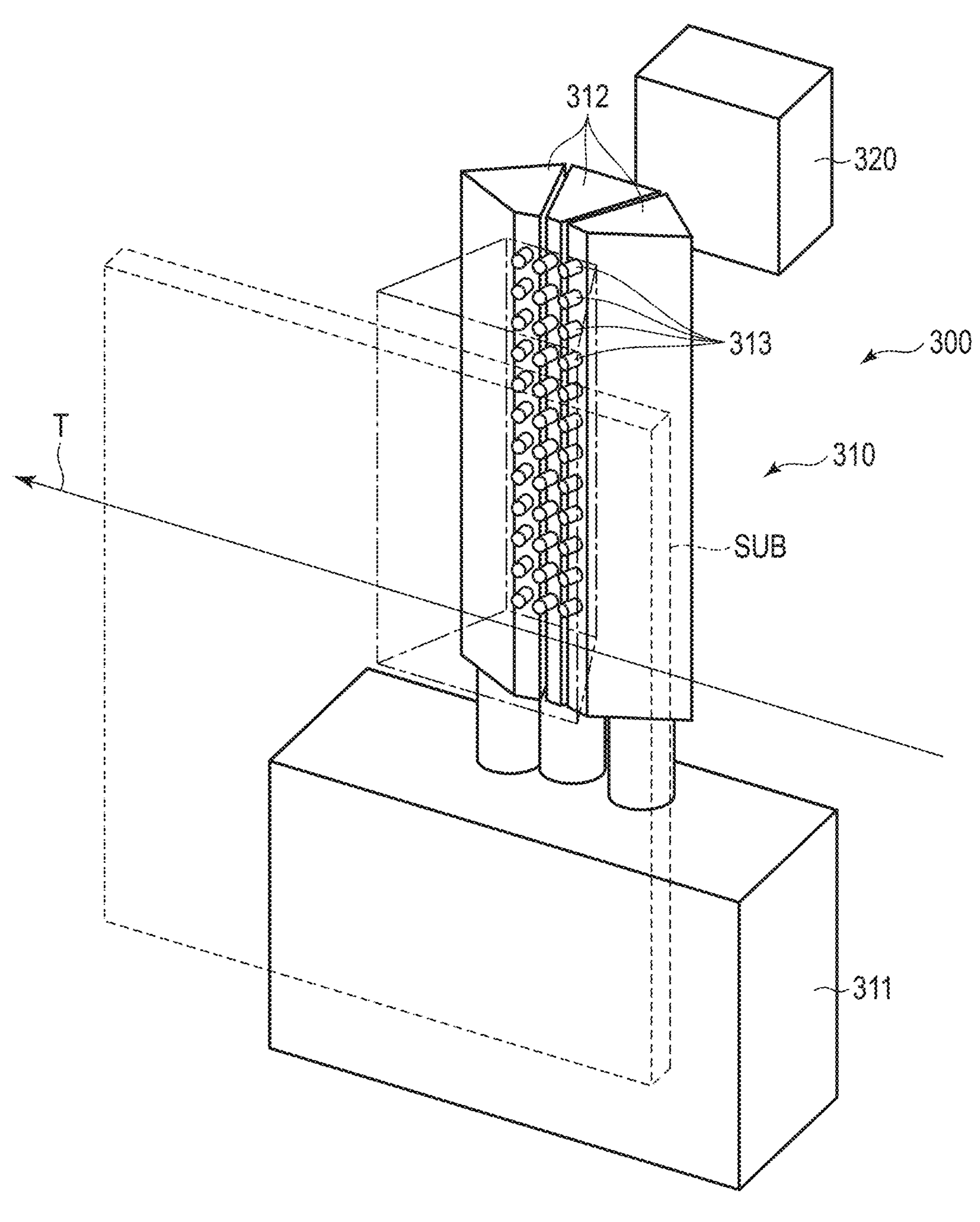
FIG. 13 is a perspective view schematically showing the main part of an evaporation portion 300.

FIG. 13 is a perspective view schematically showing the main part of an evaporation portion 300.

The evaporation portion 300 comprises an evaporation source 310 and a film thickness measurement device 320.

The evaporation source 310 comprises a crucible 311 which heats materials, a plurality of evaporation heads 312 connected to the crucible 311, and first and second nozzles 313 and 314 (314 not shown in FIG. 13) which emit the material evaporated from each of the evaporation heads 312. The first nozzles 313 provided in each of the evaporation heads 312 are arranged in a direction orthogonal to the conveyance path T of the processing substrate SUB.

The film thickness measurement device 320 faces the evaporation source 310. The conveyance path T is provided on the side opposite to the film thickness measurement device 320 across the intervening evaporation source 310.

The configuration of the evaporation portion 300 shown in FIG. 13 can be applied to each of the evaporation portions shown in FIG. 12.

Figure 14:
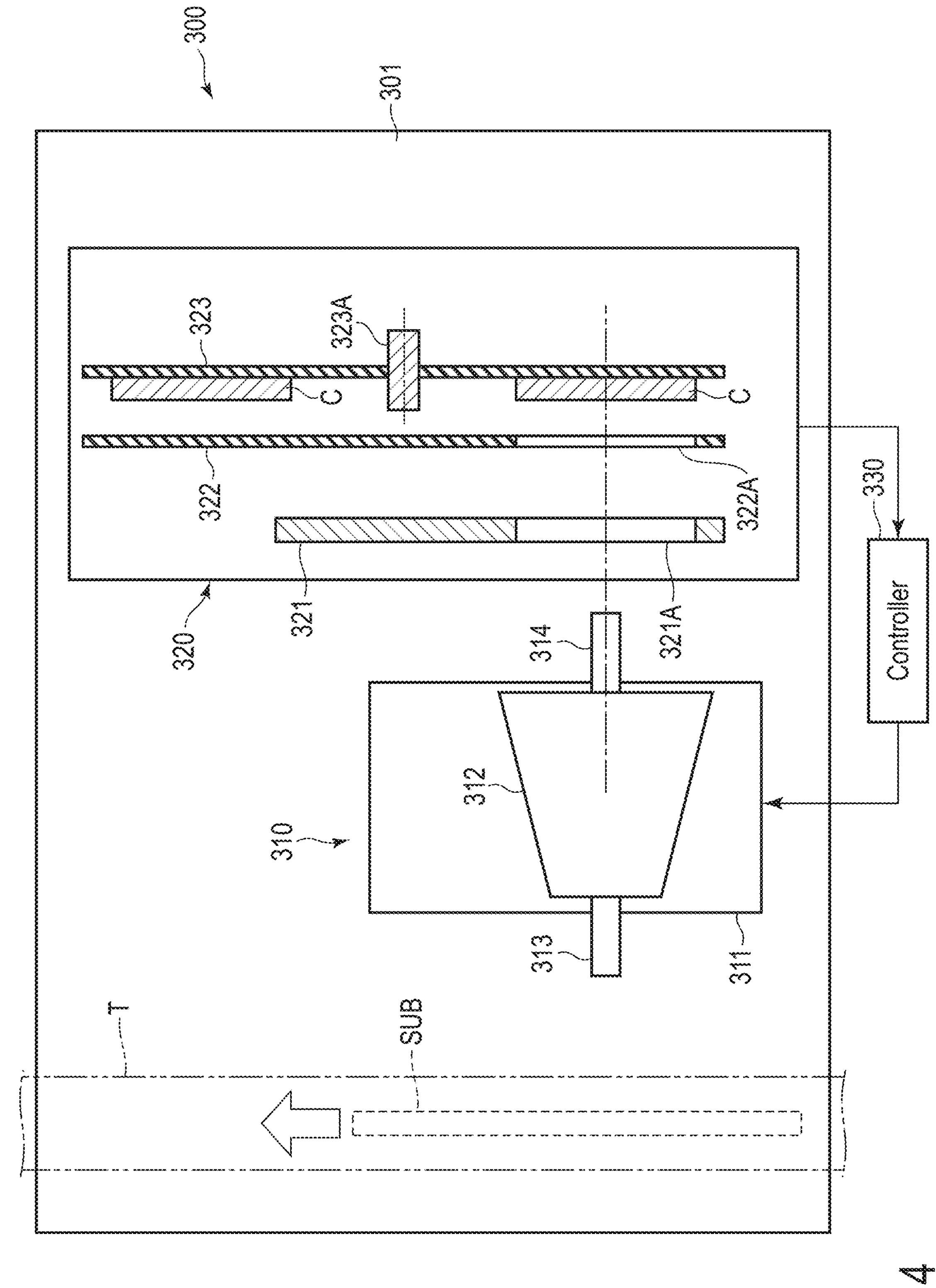
FIG. 14 is a top view schematically showing the main part of the evaporation portion 300.

FIG. 14 is a top view schematically showing the main part of the evaporation portion 300. Here, the figure shows one of the evaporation heads 312.

The evaporation source 310 and the film thickness measurement device 320 are accommodated in a chamber 301.

In the evaporation source 310, the first nozzle 313 faces the processing substrate SUB shown by broken lines or the conveyance path T shown by two-dot chain lines. The second nozzle 314 faces the film thickness measurement device 320. In other words, the nozzle (first nozzle 313) which emits a material to the processing substrate SUB is a different piece from the nozzle (second nozzle 314) which emits a material to the film thickness measurement device 320.

The film thickness measurement device 320 comprises a shutter 321 comprising an aperture 321A, a cover 322 comprising an aperture 322A, a holder 323 configured to rotate around a rotation axis 323A, and a plurality of crystal oscillators C provided on the same surface of the holder 323. The cover 322 is located between the shutter 321 and the crystal oscillators C. When the material emitted from the second nozzle 314 is deposited on a crystal oscillator C, the shutter 321 is driven such that the aperture 321A is located on the same axis as the aperture 322A.

Each crystal oscillator C comprises, for example, a structure in which a crystal plate is held between a pair of metal electrodes. When the material emitted from the second nozzle 314 is deposited on the metal electrodes, the frequency of the crystal oscillator C is changed. The frequency of the crystal oscillator C attenuates in connection with the deposition of the material. Thus, in the film thickness measurement device 320, the evaporation rate of the material is measured based on the amount of change (attenuation) in the frequency of each crystal oscillator C, and further, the thickness of the thin film formed on each crystal oscillator C and the thickness of the thin film formed on the processing substrate SUB are measured. When the evaporation rate or thickness is measured, the film thickness measurement device 320 applies an acoustic impedance correction value which defers depending on the frequency of each crystal oscillator C. This configuration is described in detail later. Here, the evaporation rate refers to the thickness of the material which is deposited per unit time.

For example, when the evaporation portion 300 shown in the figure corresponds to the fourth evaporation portion 140 shown in FIG. 12, the crucible 311 of the evaporation source 310 accommodates an organic material for forming the second transparent layer TL12. The evaporation source 310 heats the organic material accommodated in the crucible 311 and emits the evaporated organic material from the first nozzle 313 and the second nozzle 314.

The organic material emitted from the first nozzle 313 is deposited on the first transparent layer TL11 of the processing substrate SUB which is conveyed along the conveyance path T. At the same time, the organic material emitted from the second nozzle 314 is deposited on at least one of the crystal oscillators C via the aperture 321A and the aperture 322A. The film thickness measurement device 320 can measure the evaporation rate of the organic material based on the amount of change in the frequency of the crystal oscillators C.

It should be noted that the layout of the second nozzle 314 is not limited to the example shown in FIG. 14 in which the second nozzle 314 is provided on the side opposite to the first nozzle 313. The second nozzle 314 may be provided so as to face the processing substrate SUB or the conveyance path T in a manner similar to that of the first nozzle 313. From another viewpoint, the nozzles provided on, of the evaporation heads 312, the side facing the conveyance path T may include the first nozzles 313 and the second nozzles 314. In this case, the film thickness measurement device 320 is provided at a position which does not affect the deposition on the processing substrate SUB or the conveyance of the processing substrate SUB on, of the evaporation heads 312, the side facing the conveyance path T, and faces the second nozzle 314.

A controller 330 controls the evaporation source 310 such that the evaporation rate becomes constant based on the evaporation rate measured by the film thickness measurement device 320. For example, the controller 330 controls the temperature of heating the crucible 311 and adjusts the amount of the emission of the materials emitted from the first nozzle 313 and the second nozzle 314 in the evaporation source 310. The controller 330 may adjust the conveyance speed of the processing substrate SUB facing the first nozzle 313 to maintain the evaporation rate so as to be a constant set value.

The controller 330 is connected to the film thickness measurement device 320 via cable. In this case, the controller 330 may be provided inside the chamber 301 with the film thickness measurement device 320 or may be provided outside the chamber 301.

The evaporation rate is calculated by converting the slope of the attenuating frequency into thickness. In the crystal oscillators C, the easiness of transmission of oscillation differs depending on the deposited material. Thus, as the attenuation of the frequency progresses, the divergence between the calculated evaporation rate and the actual evaporation rate tends to increase. As a parameter for correcting this divergence, an acoustic impedance correction value (Z-ratio) is known.

FIG. 15 explains an example of correction by an acoustic impedance correction value.

In the figure, the horizontal axis indicates the frequency (Hz) of a crystal oscillator. In the figure, the vertical axis indicates the relative value of the evaporation rate.

In the figure, "A" indicates the actual evaporation rate before an acoustic impedance correction value is applied. In this case, the film thickness measurement device 320 measures the evaporation rate based on the amount of change in the frequency without applying an acoustic impedance correction value. The controller 330 controls the evaporation source 310 such that the evaporation rate measured by the film thickness measurement device 320 becomes constant. At this time, the set value of the evaporation rate which is maintained so as to be constant corresponds to the evaporation rate "1" in the figure.

Thus, even if the evaporation rate is controlled so as to be constant, the actual evaporation rate gradually decreases over time. In the example shown in the figure, at the time point when the frequency attenuates by approximately 0.05 MHz, the actual evaporation rate diverges from the set value by approximately 10%.

In the figure, "B" indicates the actual evaporation rate after an acoustic impedance correction value is applied. In this case, the film thickness measurement device 320 measures the evaporation rate based on the amount of change in the frequency by applying an acoustic impedance correction value unique to the deposited material. The controller 330 controls the evaporation source 310 such that the evaporation rate measured by the film thickness measurement device 320 becomes constant.

The example of the figure shows that the divergence between the actual evaporation rate and the set value is reduced compared with that before the application of the acoustic impedance correction value. However, the example also shows that the divergence of the actual evaporation rate from the set value tends to increase when the frequency attenuates by approximately 0.1 MHz or greater from the start of the use of the crystal oscillator.

In other words, even if the acoustic impedance correction value unique to the material is applied, the range which can be corrected is the very small range in the high frequencies. Thus, the crystal oscillators need to be frequently replaced.

In particular, the difference between the measured evaporation rate and the set value may adversely affect the performance of display elements in the process of manufacturing layers which require high film thickness reproducibility or the process of manufacturing layers which require great film thicknesses. In the above example, the second transparent layers TL12, TL22 and TL32, the hole transport layers HTL1, HTL2 and THL3 and the like are applicable to these layers.

In consideration of these factors, the inventor obtained an optimal acoustic impedance correction value for each frequency of crystal oscillators by repeatedly conducting the experiment of measuring the actual thickness of the material deposited on the crystal oscillators and the frequency of the crystal oscillators. For example, when the thickness calculated based on the frequency is greater than the actual thickness, an acoustic impedance correction value which is greater than the acoustic impedance correction value unique to the material is set. When the calculated thickness is less than the actual thickness, an acoustic impedance correction value which is less than the acoustic impedance correction value unique to the material is set.

The obtained acoustic impedance correction value for each frequency is tabled and held by the film thickness measurement device 320.

FIG. 16 is a diagram showing an example of a table TB held by the film thickness measurement device 320.

The table TB comprises an acoustic impedance correction value (Z-ratio) which is optimal for each frequency F of crystal oscillators. For example, the acoustic impedance correction value in the case of frequency F0 is set to Z0. The acoustic impedance correction value in the case of frequency F1 is set to Z1. The acoustic impedance correction value in the case of frequency Fn is set to Zn, where n is an integer. As n increases, correction can be stricter. In particular, according to the analysis of the inventor, as the frequency decreases, the divergence between the calculated value of the evaporation rate and the actual measured value tends to increase. Therefore, an acoustic impedance correction value corresponding to each frequency should be preferably set by segmentalizing the low-frequency range.

When a large amount of material is deposited on the crystal oscillators C, the attenuation rate of the frequency cannot be accurately detected, and further, the thickness of the deposited material cannot be accurately detected. For this reason, the lower limit of the frequency of the crystal oscillators C is set in a range in which the thickness can be accurately detected. In other words, when frequency F of a crystal oscillator C reaches the lower limit Fmin, it is possible to determine that the application limit of the crystal oscillator C has been reached. In this case, the film thickness measurement device 320 replaces the crystal oscillator C.

For example, the table TB described above is individually prepared in the evaporation portion for forming the second transparent layer, the evaporation portion for forming the hole transport layer, etc.

FIG. 17 is a flowchart for explaining an application example of an acoustic impedance correction value.

First, when frequency F of the crystal oscillators C is an initial value F0 at the time of staring the use of the crystal oscillators C in the film thickness measurement device 320, the acoustic impedance correction value is set to Z0 (step S11). Subsequently, the shutter 321 is driven such that the aperture 321A is provided on the same axes of the second nozzle 314 and the aperture 322A of the cover 322. At this time, at least one crystal oscillator C faces the second nozzle 314.

In the evaporation source 310, the material accommodated in the crucible 311 is heated, and the emission of the material from the first nozzle 313 and the second nozzle 314 is started. Here, the material is, for example, a material for forming the hole transport layer or a material for forming the second transparent layer. By this process, the deposition of the material on the crystal oscillators C is started. Further, the deposition of the material emitted from the first nozzle 313 on the processing substrate SUB is started.

In the film thickness measurement device 320, the evaporation rate is measured based on the amount of change in the frequency by applying acoustic impedance correction value Z0. The controller 330 controls the evaporation source 310 such that the evaporation rate measured by the film thickness measurement device 320 becomes constant.

Subsequently, the film thickness measurement device 320 determines whether or not frequency F of the crystal oscillator C attenuates to frequency F1 (step S12). When frequency F reaches frequency F1 (YES in step S12), the film thickness measurement device 320 sets the acoustic impedance correction value so as to be Z1 (step S13). Before frequency F reaches frequency F1, acoustic impedance correction value Z0 is applied.

Subsequently, the film thickness measurement device 320 determines whether or not frequency F of the crystal oscillator C attenuates to frequency F2 (step S14). When frequency F reaches frequency F2 (YES in step S14), the film thickness measurement device 320 sets the acoustic impedance correction value so as to be Z2 (step S15). Before frequency F reaches frequency F2, acoustic impedance correction value Z1 is applied.

A similar control process is repeatedly performed (step S16 and step S17).

Subsequently, the film thickness measurement device 320 determines whether or not frequency F of the crystal oscillator C attenuates to frequency Fmin (step S18). When frequency F reaches frequency Fmin (YES in step S18), in the film thickness measurement device 320, the holder 323 rotates, and the crystal oscillator C is replaced (step S19). Thus, another crystal oscillator C faces the second nozzle 314, and the process returns to the above step S11.

In this manner, according to the present embodiment, in each evaporation portion which deposits a material, the evaporation rate is monitored by the film thickness measurement device 320 comprising the crystal oscillators C, and the heating temperature of the material and the like are controlled such that the evaporation rate can be constant.

The film thickness measurement device 320 applies an optimal acoustic impedance correction value based on the frequency of each crystal oscillator C when the evaporation rate is calculated. Thus, the thickness calculated in the film thickness measurement device 320 is substantially equal to the actual thickness of the deposited material. In this manner, the set value of the evaporation rate controlled in each evaporation portion is substantially coincident with the actual evaporation rate.

In addition, even if the frequency attenuates as each crystal oscillator C is used, an optimal acoustic impedance correction value in the frequency is applied. Thus, the crystal oscillators C can be used even in a low-frequency range. Thus, the crystal oscillators C can be used for long periods, and the frequency of replacing the crystal oscillators C is decreased. In this manner, the reduction in the production efficiency is prevented.

Regarding the manufacture of the display elements 201, 202 and 203, when a material which is specially adjusted is deposited, or when a plurality of types of materials are deposited, an optimal impedance correction value can be obtained for each frequency of the crystal oscillators by repeatedly conducting an experiment.

As described above, the present embodiment can provide a manufacturing device of a display device and a manufacturing method of a display device such that the reduction in the production efficiency can be prevented.

All of the manufacturing devices and manufacturing methods that can be implemented by a person of ordinary skill in the art through arbitrary design changes to the manufacturing device and manufacturing method described above as the embodiments of the present invention come within the scope of the present invention as long as they are in keeping with the spirit of the present invention.

Various modification examples which may be conceived by a person of ordinary skill in the art in the scope of the idea of the present invention will also fall within the scope of the invention. For example, even if a person of ordinary skill in the art arbitrarily modifies the above embodiments by adding or deleting a structural element or changing the design of a structural element, or by adding or omitting a step or changing the condition of a step, all of the modifications fall within the scope of the present invention as long as they are in keeping with the spirit of the invention.

Further, other effects which may be obtained from the above embodiments and are self-explanatory from the descriptions of the specification or can be arbitrarily conceived by a person of ordinary skill in the art are considered as the effects of the present invention as a matter of course.

What is claimed is:

1. A manufacturing method of a display device, comprising:

preparing a processing substrate by forming a lower electrode above a substrate, forming a rib comprising an aperture which overlaps the lower electrode, and forming a partition including a lower portion located on the rib and an upper portion which is located on the lower portion and protrudes from a side surface of the lower portion;

forming an organic layer on the lower electrode in the aperture;

forming an upper electrode on the organic layer;

forming a first transparent layer on the upper electrode; and forming a second transparent layer having a refractive index which is lower than a refractive index of the first transparent layer on the first transparent layer, wherein a process of forming the organic layer, the upper electrode, the first transparent layer and the second transparent layer is a deposition process using the partition as a mask, and in the deposition process of forming at least one of the organic layer, the upper electrode, the first transparent layer and the second transparent layer, an evaporation source emits a material to the processing substrate and a film thickness measurement device, the film thickness measurement device applies an acoustic impedance correction value which differs depending on a frequency of a crystal oscillator, and measures an evaporation rate based on an amount of change in the frequency of the crystal oscillator, and a controller controls the evaporation source such that the evaporation rate becomes constant.

2. The manufacturing method of claim 1, wherein the evaporation source emits an organic material for forming the second transparent layer.

3. The manufacturing method of claim 2, wherein the second transparent layer is formed by depositing the organic material while conveying the processing substrate in which the first transparent layer is formed along a conveyance path on a side opposite to the film thickness measurement device across the intervening evaporation source.

4. The manufacturing method of claim 1, wherein the organic layer, the upper electrode, the first transparent layer and the second transparent layer formed immediately above the upper portion of the partition are spaced apart from the organic layer, the upper electrode, the first transparent layer and the second transparent layer formed immediately above the lower electrode in the aperture.

5. The manufacturing method of claim 4, wherein a sealing layer is further formed using an inorganic insulating material having a refractive index which is higher than the refractive index of the second transparent layer after the second transparent layer is formed, and the sealing layer covers the second transparent layer located on the partition, covers the second transparent layer located immediately above the lower electrode, and is in contact with the partition.

6. The manufacturing method of claim 5, wherein a patterned resist is further formed on the sealing layer after the sealing layer is formed, and the sealing layer, the second transparent layer, the first transparent layer, the upper electrode and the organic layer exposed from the resist are removed by etching in series.

7. A manufacturing device of a display device, comprising:

a first evaporation portion which forms an organic layer while conveying a processing substrate comprising:

a lower electrode located above a substrate;

a rib comprising an aperture which overlaps the lower electrode; and a partition including a lower portion located on the rib and an upper portion which is located on the lower portion and protrudes from a side surface of the lower portion, the organic layer being formed on the lower electrode in the aperture;

a second evaporation portion which forms an upper electrode on the organic layer;

a third evaporation portion which forms a first transparent layer on the upper electrode; and a fourth evaporation portion which forms, on the first transparent layer, a second transparent layer having a refractive index which is lower than a refractive index of the first transparent layer, wherein at least one of the first evaporation portion, the second evaporation portion, the third evaporation portion and the fourth evaporation portion comprises:

an evaporation source comprising a first nozzle which faces a conveyance path of the processing substrate and a second nozzle provided on a side opposite to the first nozzle;

a film thickness measurement device which comprises a crystal oscillator facing the second nozzle, holds a table of an acoustic impedance correction value which differs depending on a frequency of the crystal oscillator, and is configured to measure an evaporation rate based on an amount of change in the frequency of the crystal oscillator; and a control unit which controls the evaporation source such that the evaporation rate becomes constant.

8. The manufacturing device of claim 7, wherein the evaporation source is configured to emit an organic material for forming the second transparent layer.

* * * * *